(12) United States Patent
Park et al.

(10) Patent No.: US 12,426,245 B2
(45) Date of Patent: Sep. 23, 2025

(54) SEMICONDUCTOR DEVICE

(71) Applicant: Samsung Electronics Co., Ltd., Suwon-si (KR)

(72) Inventors: Kyungwook Park, Pohang-si (KR); Sangmin Kang, Hwaseong-si (KR); Yoongoo Kang, Hwaseong-si (KR); Changwoo Seo, Hwaseong-si (KR); Suyoun Song, Hwaseong-si (KR); Dain Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/090,043

(22) Filed: Dec. 28, 2022

(65) Prior Publication Data

US 2023/0292491 A1   Sep. 14, 2023

(30) Foreign Application Priority Data

Mar. 11, 2022   (KR) .................. 10-2022-0030595

(51) Int. Cl.
*H10B 12/00*   (2023.01)

(52) U.S. Cl.
CPC ....... *H10B 12/315* (2023.02); *H10B 12/0335* (2023.02); *H10B 12/34* (2023.02); *H10B 12/482* (2023.02)

(58) Field of Classification Search
CPC ..... H10B 12/315; H10B 12/482; H10B 12/34
See application file for complete search history.

(56) References Cited

U.S. PATENT DOCUMENTS

| | | | |
|---|---|---|---|
| 9,165,934 B2 | 10/2015 | Choi et al. | |
| 9,953,981 B2 | 4/2018 | Kim et al. | |
| 10,411,014 B2 | 9/2019 | Hwang et al. | |
| 10,573,652 B2 | 2/2020 | Lee et al. | |
| 10,790,150 B2 | 9/2020 | Kim et al. | |
| 11,183,500 B2* | 11/2021 | Song | H10B 12/053 |
| 2005/0272210 A1 | 12/2005 | Lee et al. | |
| 2017/0271340 A1* | 9/2017 | Kim | H10B 12/0335 |
| 2017/0352666 A1* | 12/2017 | Ahn | H10B 12/482 |
| 2020/0388620 A1* | 12/2020 | Park | H10B 12/315 |
| 2021/0066200 A1* | 3/2021 | Park | H10B 12/0335 |
| 2021/0217625 A1 | 7/2021 | Chung et al. | |
| 2022/0077152 A1 | 3/2022 | Lim et al. | |
| 2023/0354585 A1* | 11/2023 | Chan | H10B 12/01 |

FOREIGN PATENT DOCUMENTS

| | | |
|---|---|---|
| KR | 10-0609542 A | 12/2005 |
| KR | 1020200107895 A | 9/2020 |

\* cited by examiner

*Primary Examiner* — Steven M Page
(74) *Attorney, Agent, or Firm* — Muir Patent Law, PLLC

(57) ABSTRACT

A semiconductor device may include contact plug structures on a substrate, and an insulation structure filling a space between the contact plug structures to insulate the contact plug structures from each other. The contact plug structures may be spaced apart from each other in a first direction. The insulation structure may include a first insulation pattern and a second insulation pattern. The second insulation pattern may include an insulation material having an etch selectivity with respect to silicon oxide. The first insulation pattern may contact a portion of sidewalls of the second insulation pattern and a portion of sidewalls of the contact plug structure. The first insulation pattern may include a material having a band gap higher than a band gap of the second insulation pattern.

20 Claims, 41 Drawing Sheets

FIG. 1
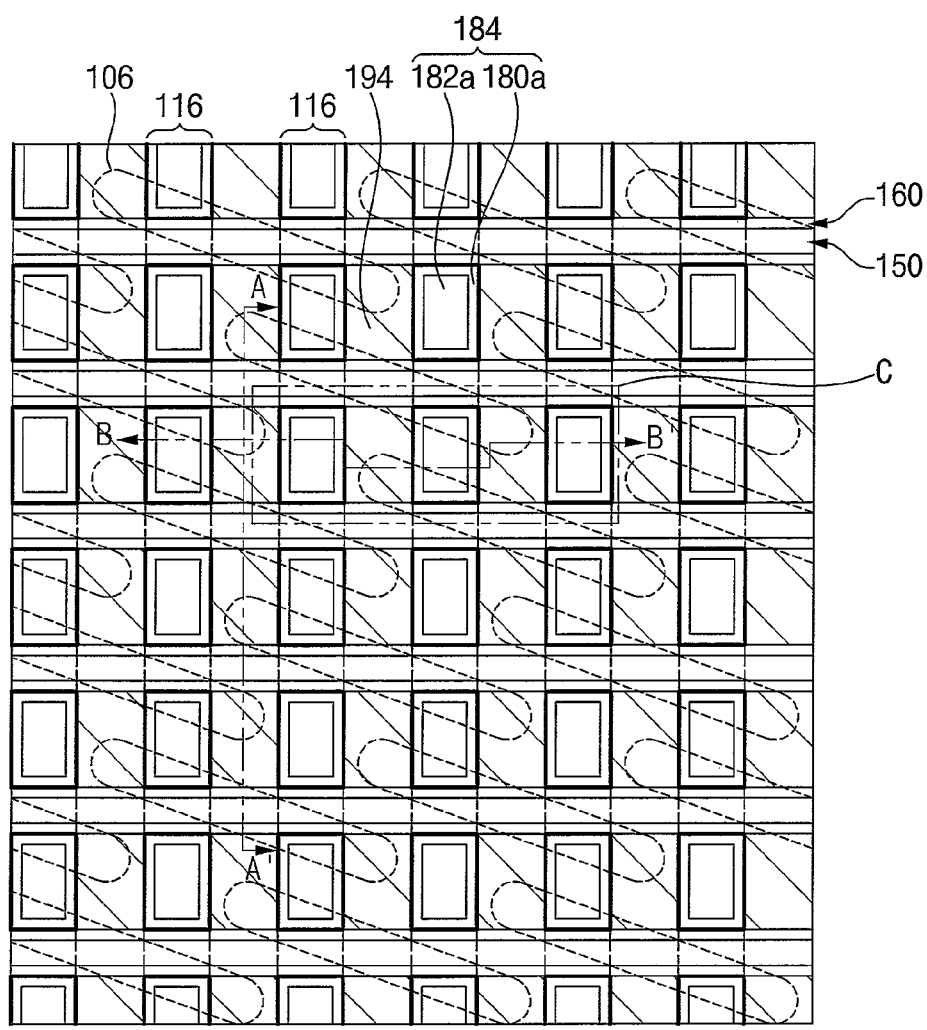
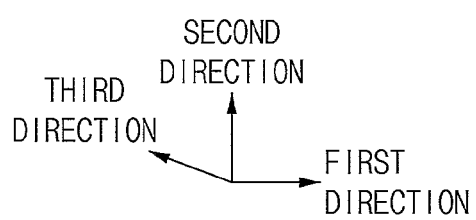

FIG. 4
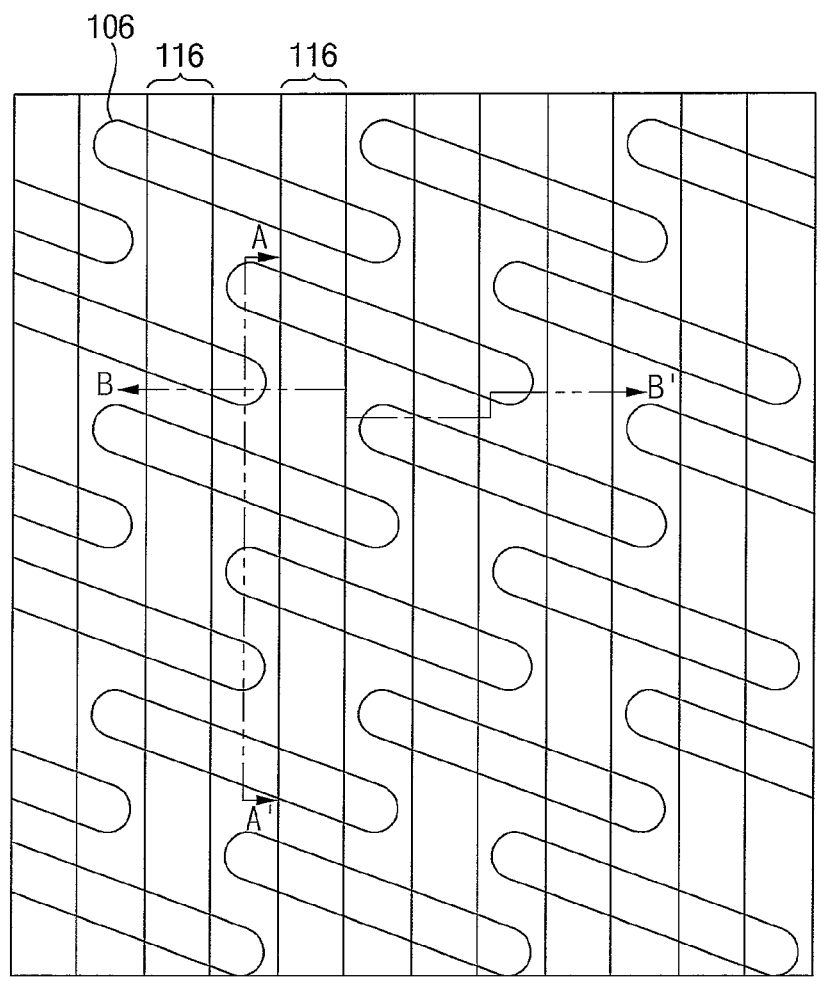
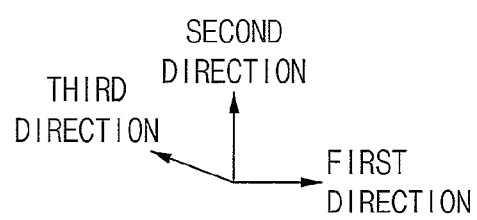

FIG. 5
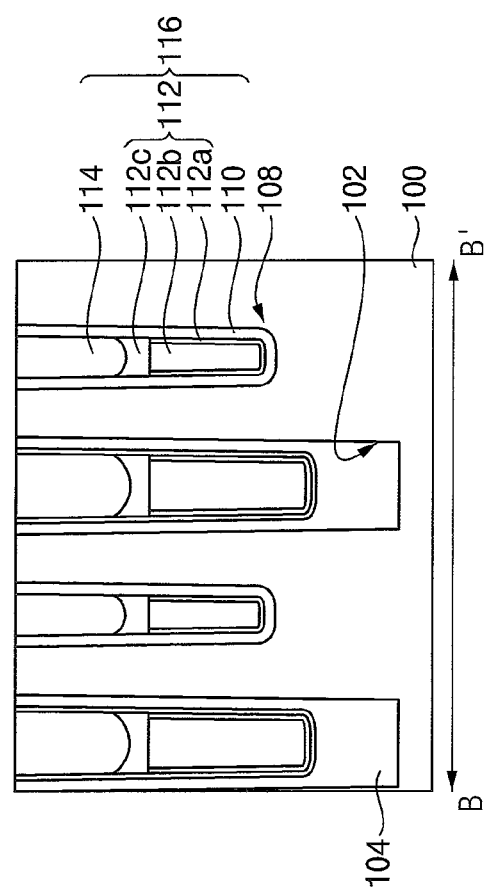
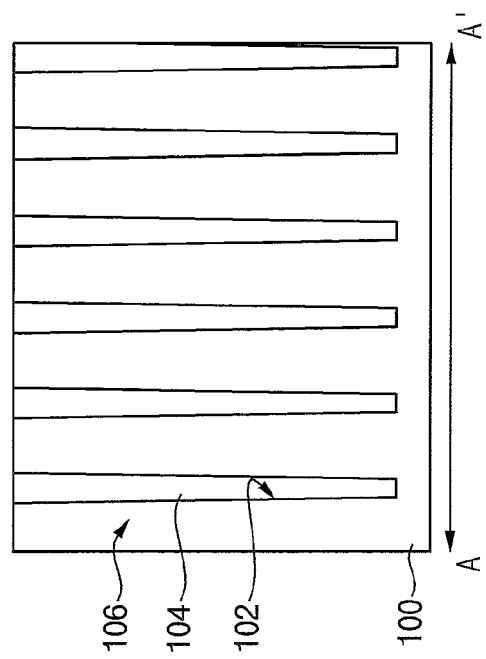

FIG. 9
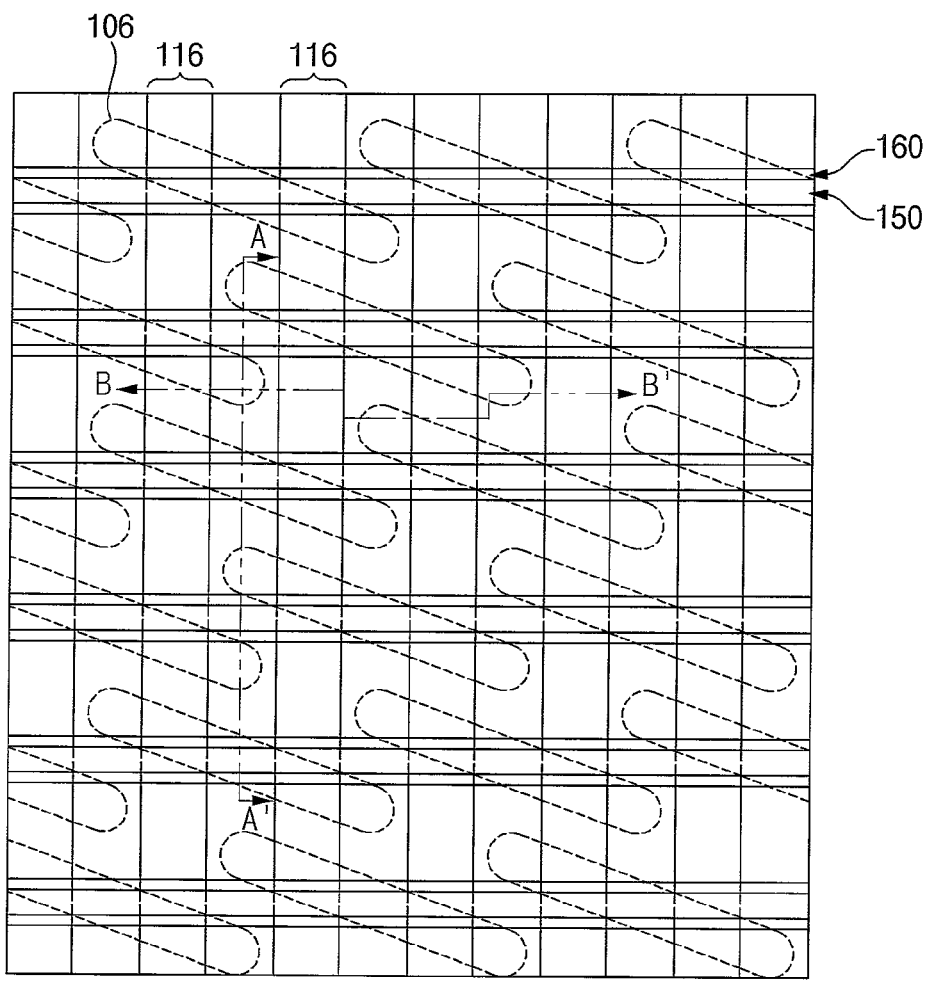
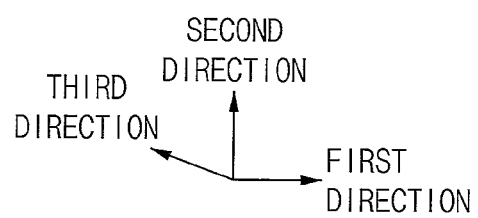

FIG. 12
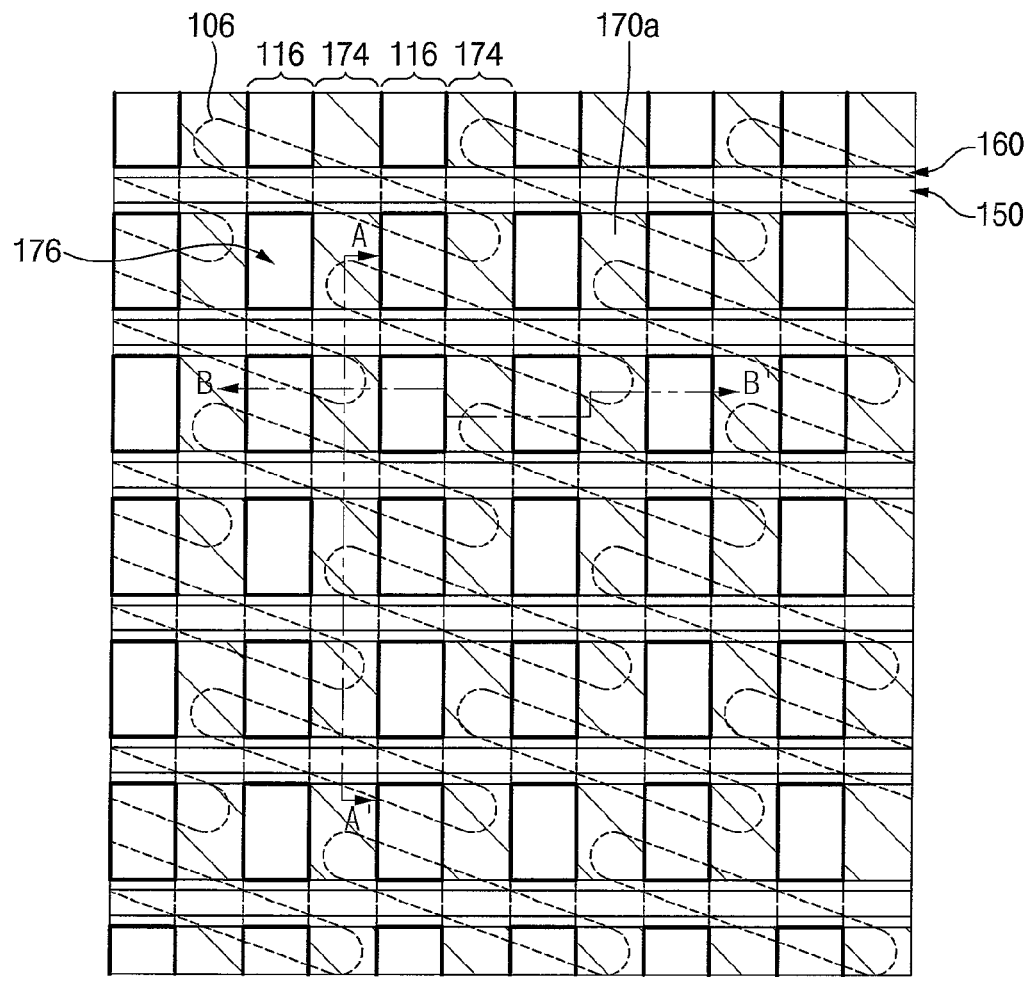
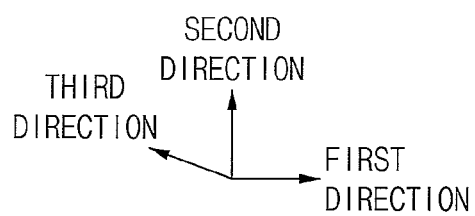

FIG. 16
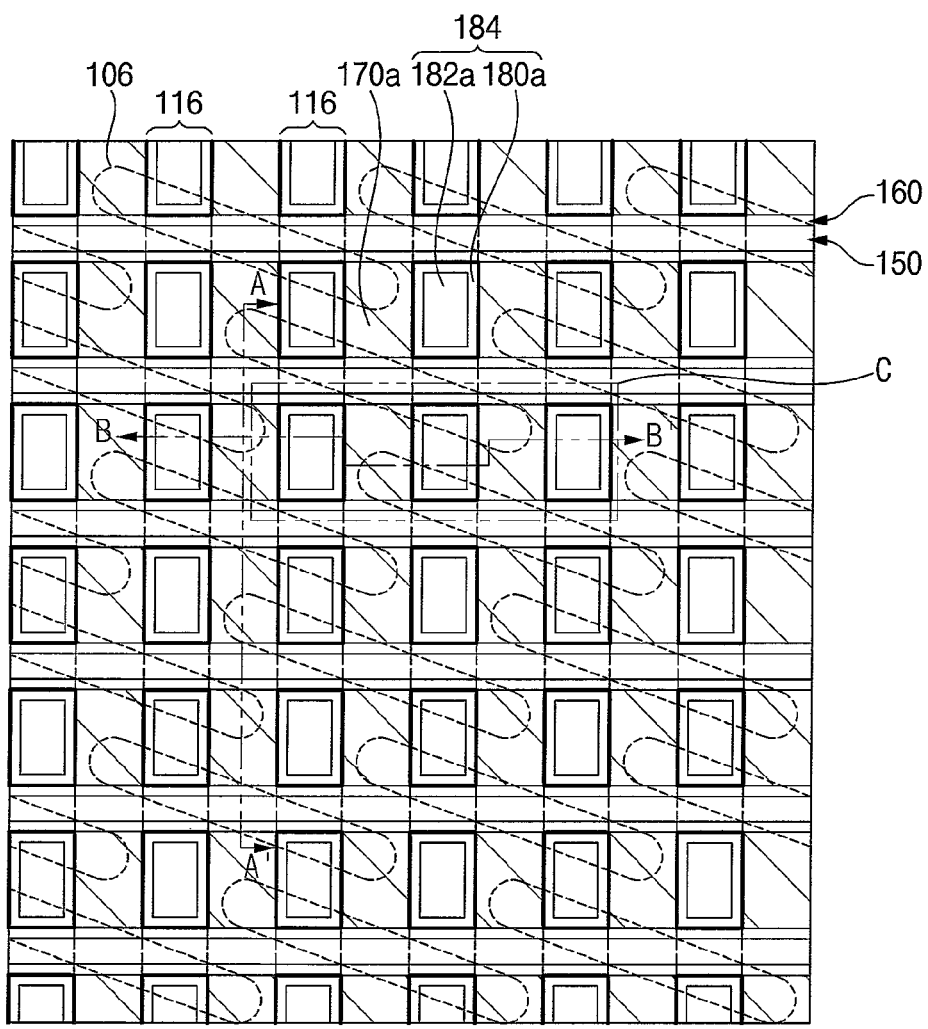
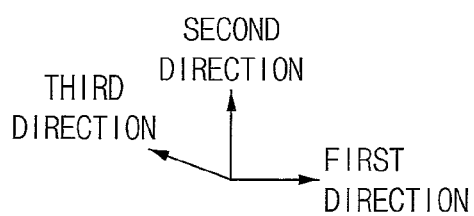

SEMICONDUCTOR DEVICE

CROSS-REFERENCE TO RELATED APPLICATION

This application claims priority under 35 USC § 119 to Korean Patent Application No. 10-2022-0030595, filed on Mar. 11, 2022, in the Korean Intellectual Property Office (KIPO), the contents of which are incorporated by reference herein in their entirety.

BACKGROUND

1. Field

Embodiments relate to a semiconductor device. More particularly, embodiments relate to a DRAM device.

2. Description of the Related Art

In a semiconductor device, some of the provided contact plugs may be repeatedly disposed to be uniformly spaced apart from each other. As the semiconductor device is highly integrated, a distance between the contact plugs may be decreased, and an arrangement density of the contact plugs may be very high. Therefore, an electrical isolation between the contact plugs may be difficult.

SUMMARY

Example embodiments provide a semiconductor device having contact plugs.

According to example embodiments, there is provided a semiconductor device. The semiconductor device may include contact plug structures on a substrate, and an insulation structure filling a space between the contact plug structures to insulate the contact plug structures from each other. The contact plug structures may be spaced apart from each other in a first direction. The insulation structure may include a first insulation pattern and a second insulation pattern. The second insulation pattern may include an insulation material having an etch selectivity with respect to silicon oxide. The first insulation pattern may contact a portion of sidewalls of the second insulation pattern and a portion of sidewalls of the contact plug structure. The first insulation pattern may include a material having a band gap higher than a band gap of the second insulation pattern.

According to example embodiments, there is provided a semiconductor device. The semiconductor device may include bit line structures on a substrate. contact plug structures on the substrate between the bit line structures, and an insulation structure filling an opening between the contact plug structures to insulate the contact plug structures from each other. Each of the bit line structure may extend in a first direction. The bit line structures may be spaced apart from each other in a second direction perpendicular to the first direction. The contact plug structure may be spaced apart from each other in the first direction. The insulation structure may include a first insulation pattern and a second insulation pattern. The second insulation pattern may include an insulation material having an etch selectivity with respect to silicon oxide. The first insulation pattern may surround sidewalls and a bottom of the second insulation pattern. The first insulation pattern may include a material having a band gap higher than a band gap of the second insulation pattern.

According to example embodiments, there is provided a semiconductor device. The semiconductor device may include an active pattern on a substrate, gate structures buried in an upper portion of the active pattern, bit line structures on the substrate, a spacer structure on a sidewall of each of the bit line structures, contact plug structures formed in an opening between the bit line structures on the substrate, an insulation structure filling a region between the bit line structures and between the contact plugs to insulate the contact plug structures from each other. The gate structure may be spaced apart from each other in a first direction, and the gate structure may extend in a second direction perpendicular to the first direction. The bit line structures may extend in the first direction, and the bit line structures may be spaced apart from each other in the second direction. The contact plug structures may be spaced apart from each other in the first direction. The second insulation pattern may include silicon nitride. The first insulation pattern may contact a portion of sidewalls of the second insulation pattern and a portion of sidewalls of the contact plug structure. The first insulation pattern may include a material having a band gap higher than a band gap of the second insulation pattern.

In example embodiments, in a semiconductor device, an insulation structure for insulating of adjacent contact plug structures may include a first insulation pattern having a high band gap with respect to the contact plug structures. Accordingly, leakage currents due to tunneling of holes and electrons between the adjacent contact plug structures may be decreased. Accordingly, defects of the semiconductor device including the contact plug structures may be decreased, and electrical characteristics of the semiconductor device may be improved.

BRIEF DESCRIPTION OF THE DRAWINGS

Example embodiments will be more clearly understood from the following detailed description taken in conjunction with the accompanying drawings. FIGS. 1 to 41 represent non-limiting, example embodiments as described herein.

FIG. 1 is a plan view of a semiconductor device in accordance with example embodiments;

FIG. 2 is a cross-sectional view of a semiconductor device in accordance with example embodiments;

FIG. 3 is an enlarged plan view of a portion of the semiconductor device;

FIGS. 4 to 19 are cross-sectional views and plan views illustrating a method of manufacturing a semiconductor device in accordance with example embodiments;

FIGS. 20 and 21 are cross-sectional views illustrating a method for manufacturing a semiconductor device in accordance with example embodiments;

FIGS. 22 to 27 are cross-sectional views illustrating a method of manufacturing a semiconductor device in accordance with example embodiments;

FIGS. 28 to 32 are cross-sectional views illustrating a method of manufacturing a semiconductor device in accordance with example embodiments;

FIG. 33 is a plan view of the semiconductor device in accordance with example embodiments;

FIG. 34 is an enlarged plan view of a portion of the semiconductor device in accordance with example embodiments;

FIGS. 35 and 36 are cross-sectional views illustrating a method of manufacturing a semiconductor device in accordance with example embodiments;

FIG. 37 is an enlarged plan view of a portion of a semiconductor device in accordance with example embodiments;

FIG. 38 is a cross-sectional view of a semiconductor device in accordance with example embodiments;

FIG. 39 is an enlarged plan view of a portion of a semiconductor device in accordance with example embodiments;

FIG. 40 is a cross-sectional view of a semiconductor device in accordance with example embodiments; and FIG. 41 illustrates energy levels of a contact plug structure and a fence insulation structure in a semiconductor device in accordance with example embodiments.

DESCRIPTION OF EMBODIMENTS

Figure 2:
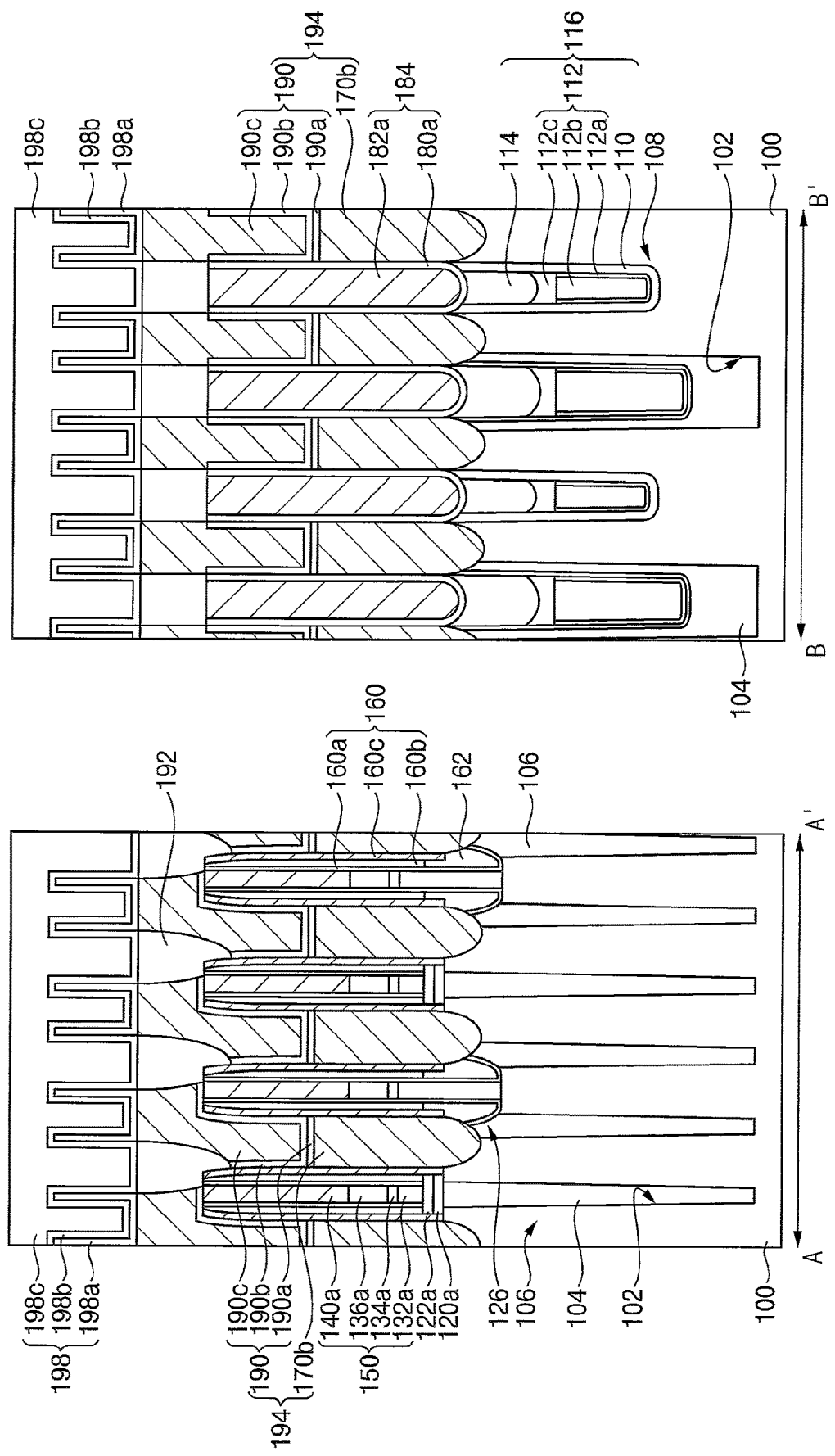
Figure 3:
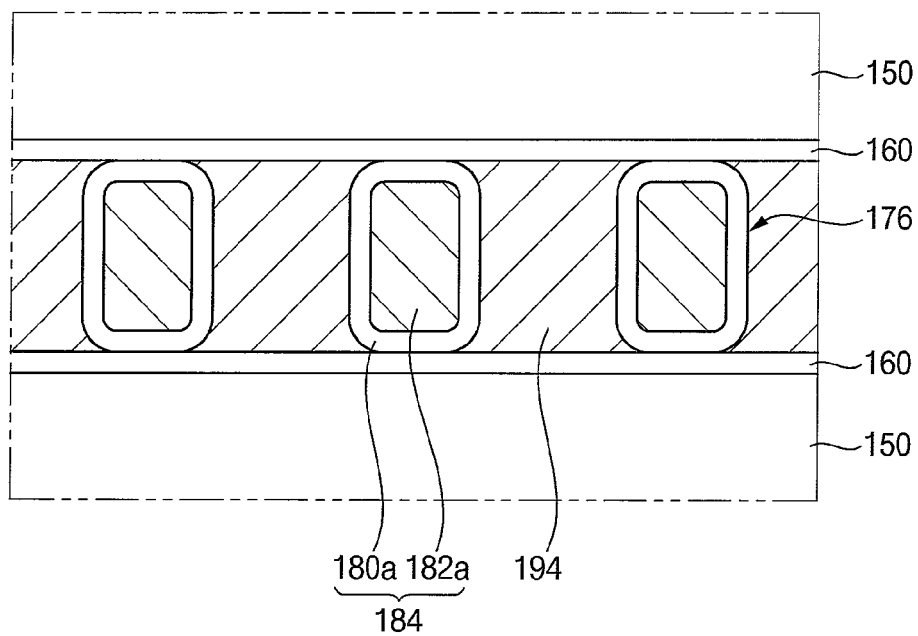

FIG. 1 is a plan view of a semiconductor device in accordance with example embodiments. FIG. 2 is a cross-sectional view of a semiconductor device in accordance with example embodiments. FIG. 3 is an enlarged plan view of a portion of the semiconductor device.

Particularly, FIG. 3 is an enlarged view of part C of FIG. 1. FIG. 3 shows contact plug structures and fence structures.

Hereinafter, an extension direction of a bit line structure is referred to as a first direction, and a direction perpendicular to the first direction (e.g., an extension direction of a gate structure) is referred to as a second direction. In addition, a longitudinal direction of the active pattern is referred to as a third direction. The third direction may have an inclination with respect to each of the first and second directions.

Referring to FIGS. 1, 2 and 3, an isolation trench 102 may be included at an upper portion of a substrate 100, and an active pattern 106 may be between the isolation trenches 102. The active pattern 106 may protrude from the substrate 100 in a fourth direction perpendicular to the first and second directions. The active pattern 106 may have a bar shape extending in the third direction. The active pattern 106 may be arranged such that the third direction is the longitudinal direction. An isolation pattern 104 may be formed in the isolation trench 102.

A first recess 108 extending in the second direction may be formed on the active pattern 106 and the isolation pattern 104. A gate structure 116 may be formed in the first recess 108. A plurality of gate structures 116 may be spaced apart from each other in the first direction. Gate structures 116 may be referred to as "buried" gate structures. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

The gate structure 116 may include a first gate insulation layer 110, a first gate electrode 112, and a first capping layer pattern 114. In example embodiments, the first gate electrode 112 may include a barrier metal layer pattern 112a, a metal layer pattern 112b and a polysilicon layer pattern 112c.

A bit line structure 150 may be formed on the gate structure 116 and the substrate 100. The bit line structure 150 may extend in the first direction. A plurality of bit line structures 150 may be spaced apart from each other in the second direction. The bit line structure 150 may include a lower conductive pattern 132a, a barrier layer pattern 134a, a first metal pattern 136a, and a second capping layer pattern 140a sequentially stacked in the fourth direction.

A portion of a bottom of the bit line structure 150 may contact a central portion of an upper surface of the active pattern 106. A first buffer insulation pattern 120a and a second buffer insulation pattern 122a may be stacked on the substrate 100 under the bottom of the bit line structure 150. A portion of the bottom of the bit line structure 150 may contact the second buffer insulation pattern 122a. A spacer structure 160 may be formed on a sidewall of the bit line structure 150.

A contact plug structure 194 may be formed between the bit line structures 150, and the contact plug structure 194 may contact both edge portions of the upper surface of the active pattern 106. The contact plug structure 194 may be disposed between the bit line structures 150, and the contact plug structure 194 may contact the upper surface of the active pattern 106 between the gate structures 116. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The contact plug structure 194 may include or may be formed of metal and/or polysilicon. The contact plug structure 194 may include or may be formed of the metal, so that the contact plug structure 194 may have a low resistance.

In example embodiments, the contact plug structure 194 may include a lower contact plug 170b and an upper contact plug 190. The lower contact plug 170b may include or may be formed of the polysilicon, and the upper contact plug 190 may include or may be formed of the metal. For example, the upper contact plug 190 may include or may be formed of a metal silicide pattern 190a, a barrier metal pattern 190b, and a metal pattern 190c. The metal silicide pattern 190a may include or may be formed of cobalt silicide, nickel silicide, titanium silicide, or the like. The barrier metal pattern 190b may include or may be formed of titanium nitride, titanium, tantalum nitride, tantalum, or the like. The metal pattern 190c may include or may be formed of tungsten or the like.

In some example embodiments, the upper contact plug 190 including the metal may have a height higher than a height of the lower contact plug 170b including the polysilicon. As used herein, "height" may refer to a measurement taken in respect to the fourth direction.

In some example embodiments, the contact plug structure 194 may include only metal or metal alloy. For example, the contact plug structure 194 may include or may be formed of the metal silicide pattern, the barrier metal pattern, and the metal pattern.

In some example embodiments, the contact plug structure 194 may include only polysilicon.

A fence insulation structure 184 may be formed between the contact plug structures 194 in the first direction. The contact plug structures 194 may be electrically insulated from each other by the fence insulation structure 184. For example, a fence insulation structure may refer to an individual insulative pillar or post extending in a vertical direction, or may include a plurality of such pillars or posts (also described as "pickets") arranged along the first direction, each extending in the vertical direction. Together, a set of such pillars or posts may resemble a fence shape. A group of pillars arranged in the first direction, or an individual pillar, may be described generally as an insulation structure.

The fence insulation structure 184 may include a barrier insulation pattern 180a and a fence insulation pattern 182a. In example embodiments, the barrier insulation pattern 180a may surround a sidewall and a bottom of the fence insulation pattern 182a. The barrier insulation pattern 180a may completely surround an outer wall of the fence insulation pattern 182a. The barrier insulation pattern and the fence insulation pattern may also be referred to herein as first insulation pattern and second insulation pattern, respectively.

The fence insulation structure 184 may be formed in an opening defined by neighboring contact plug structures 194 and neighboring bit line structure 150. A sidewall of the spacer structure 160 may be exposed by the opening.

The barrier insulation pattern 180a may be formed along an inner surface of the opening. The fence insulation pattern 182a may be formed on the barrier insulation pattern 180a to fill the opening. Thus, the barrier insulation pattern 180a may contact a portion of the sidewall of the spacer structure 160 exposed by the opening.

The fence insulation pattern 182a may include an insulation material having an etch selectivity with respect to a silicon oxide. The barrier insulation pattern 180a may include a material having a band gap higher than a band gap of the fence insulation pattern 182a.

In example embodiments, the fence insulation pattern 182a may include or may be formed of silicon nitride. In this case, the barrier insulation pattern 180a may include or may be formed of a material having a band gap higher than that of silicon nitride.

In some example embodiments, the fence insulation pattern 182a may include or may be formed of SiOCN, BN, or SiOC having a dielectric constant lower than a dielectric constant of silicon nitride.

In example embodiments, the barrier insulation pattern 180a may include or may be formed of aluminum nitride, silicon oxide, aluminum oxide, aluminum oxynitride, silicon oxynitride, or BN. For example, the barrier insulation pattern 180a may be formed of aluminum-doped silicon nitride or aluminum-doped silicon oxynitride.

The barrier insulation pattern 180a may contact a portion of an outer wall of the contact plug structure 194. The barrier insulation pattern 180a may contact sidewalls of the two contact plug structures 194 facing each other in the first direction, respectively.

As shown in FIG. 3, the contact plug structure 194/fence insulation structure 184/contact plug structure 194/fence insulation structure 184 may be repeatedly arranged in the first direction at a region between the bit line structures 150.

When a distance between the contact plug structures 194 is very small and the energy band gap of the fence insulation structure 184 formed between the contact plug structures 194 is low, tunneling of electrons and holes through the fence insulation structure 184 may be increased. Therefore, leakage currents between the contact plug structures 194 may occur. Particularly, when the contact plug structure 194 includes a metal having a low resistance, the energy band gap of the fence insulation structure 184 may be lowered. Therefore, the leakage currents between the contact plug structures 194 may be increased.

However, as the fence insulation structure 184 includes the fence insulation pattern 182a and the barrier insulation pattern 180a having a band gap higher than the band gap of the fence insulation pattern 182a, a tunneling of electrons and holes through the fence insulation structure 184 may be decreased. Therefore, the leakage currents between the contact plug structures 194 may be prevented.

As shown in FIG. 3, when the fence insulation structure 184 is formed by performing an actual semiconductor manufacturing process (e.g., a photolithography process, etc.), each corner portion of the fence insulation structure 184 may have a rounded shape. In a plan view, the fence insulation structure 184 may have a rectangular shape or an elliptical shape in which a vertex portion has a round or curved shape. In this case, the barrier insulation pattern 180a may have a relatively thick thickness at the rounded corner portion. Therefore, the leakage currents generated at the rounded corner portion may be decreased.

In example embodiments, an upper surface of the contact plug structure 194 may serve as a landing pad for connecting the capacitor 198. In example embodiments, an uppermost surface of the contact plug structure 194 may be higher than upper surfaces of the bit line structure 150 and the fence insulation structure 184 in the fourth direction.

A capacitor 198 may contact the upper surface of the contact plug structure 194. The capacitor 198 may include a lower electrode 198a, a dielectric layer 198b, and an upper electrode 198c stacked.

Hereinafter, a method of manufacturing the semiconductor device and each of elements of the semiconductor device are described in more detail.

FIGS. 4 to 19 are cross-sectional views and plan views illustrating a method of manufacturing a semiconductor device in accordance with example embodiments.

Particularly, FIGS. 4, 9, 12 and 16 are plan views, and FIGS. 5 to 8, 10, 11, 13 to 15, and 17 to 19 are cross-sectional views. Each of the cross-sectional views includes cross-sections of lines A-A' and B-B' of FIG. 4.

Referring to FIGS. 4 and 5, a portion of a substrate 100 may be etched to form an isolation trench 102 corresponding to a field region.

The substrate 100 may include, e.g., a semiconductor material such as silicon, germanium, silicon-germanium, or the like, or a III-V compound such as GaP, GaAs, or GaSb. In some example embodiments, the substrate 100 may be a silicon-on-insulator (SOI) substrate or a germanium-on-insulator (GOI) substrate.

A protruding portion of the substrate 100 on which the isolation trench 102 is not formed may serve as an active pattern 106. An upper surface of the active pattern 106 may serve as an active region. The active region may be arranged such that the third direction is the longitudinal direction.

An isolation pattern 104 may be formed to fill the isolation trench 102. An insulation layer may be formed to completely fill the isolation trench 102, and an upper portion of the insulation layer may be planarized to form the isolation pattern 104. The planarization process may include a chemical mechanical polishing (CMP) and/or an etch-back process.

The active pattern 106 and the isolation pattern 104 may be doped with impurities by, e.g., an ion implantation process to form an impurity region (not shown) at upper portions of the active pattern 106 and the isolation pattern 104.

The active pattern 106 and the isolation pattern 104 may be partially etched to form a first recess 108 extending in the second direction. Thereafter, a gate structure 116 may be formed in the first recess 108.

The gate structure 116 may include a first gate insulation layer 110, a first gate electrode 112 and a first capping layer pattern 114. The first gate insulation layer 110 may be conformally formed on an inner surface of the first recess 108. The first gate electrode 112 may be formed on the first gate insulation layer 110 to fill a lower portion of the first recess 108. The first capping layer pattern 114 may be formed on the first gate electrode 112 to fill an upper portion of the first recess 108. In example embodiments, the first gate electrode 112 may include a barrier metal layer pattern 112a, a metal layer pattern 112b, and a polysilicon layer pattern 112c.

The gate structure 116 may extend in the second direction. A plurality of the gate structures may be spaced apart from each other in the first direction.

Figure 6:
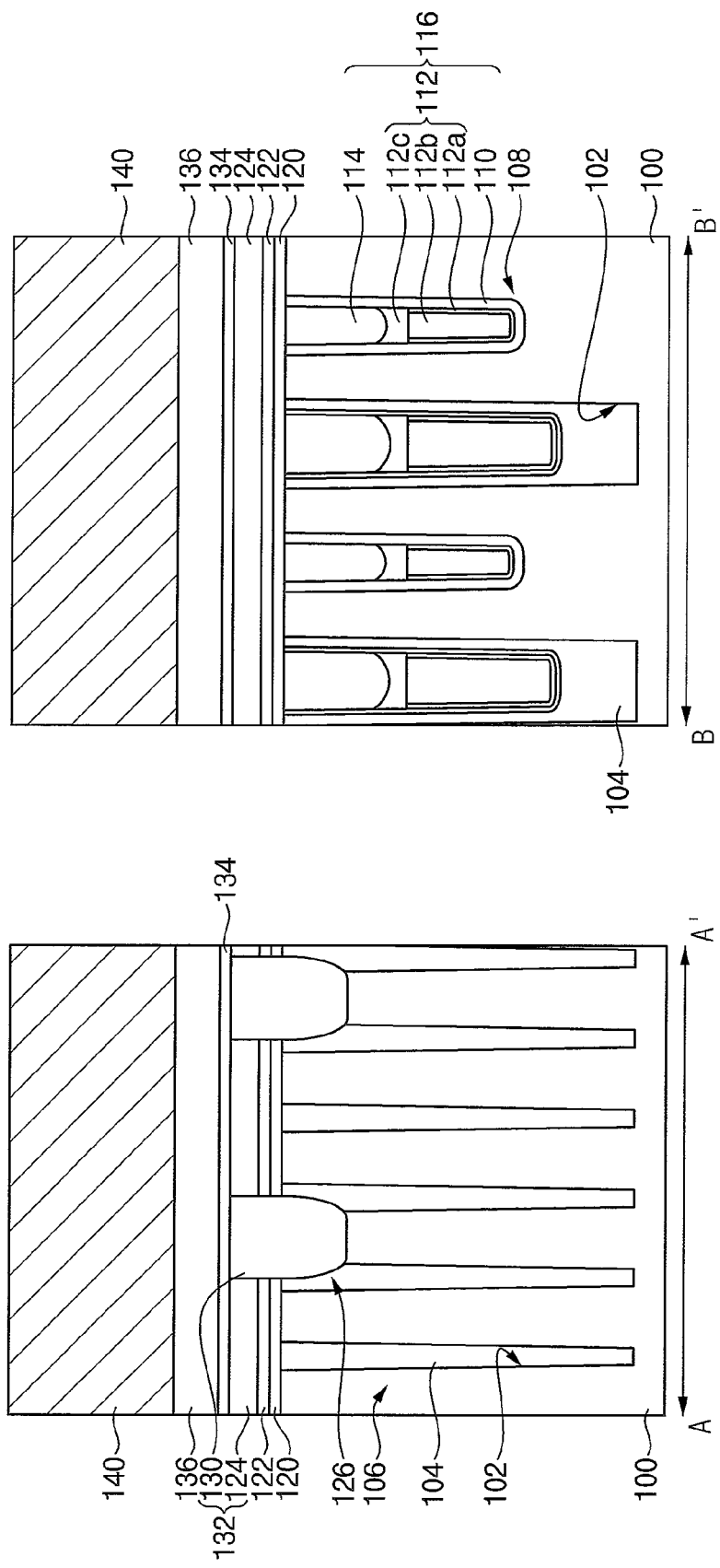

Referring to FIG. 6, a first buffer insulation layer 120 and a second buffer insulation layer 122 may be sequentially formed on the upper surfaces of the active pattern 106, the isolation pattern 104 and the first capping layer pattern 114. The first and second buffer insulation layers 120 and 122 may be formed to insulate between a conductive pattern (e.g., a bit line structure) formed thereon and the active pattern 106. The first and second buffer insulation layers 120 and 122 may include insulation materials, respectively. The materials of the first and second buffer insulation layers 120 and 122 may have an etch selectivity with respect to each other.

In example embodiments, the first buffer insulation layer 120 may include or may be formed of silicon oxide, and the second buffer insulation layer 122 may include or may be formed of silicon nitride.

A first conductive layer 124 may be formed on the second buffer insulation layer 122. The first conductive layer 124 may include, e.g., polysilicon doped with impurities. Portions of the first conductive layer 124, the second buffer insulation layer 122 and the first buffer insulation layer 120 may be sequentially etched, and then upper portions of the active pattern 106 and the isolation pattern 104 and the gate structure 116 adjacent to the active pattern 106 may be over-etched together to form a first opening 126. In example embodiments, an upper surface of a central portion in the longitudinal direction of each of the active patterns 106 may be exposed by a bottom of the first opening 126.

A second conductive layer pattern 130 may be formed in the first opening 126. The second conductive layer pattern 130 may include a material substantially the same as a material of the first conductive layer 124. The second conductive layer pattern 130 may include or may be formed of, e.g., polysilicon doped with impurities. The first conductive layer 124 and the second conductive layer pattern 130 may be merged into a single lower conductive layer 132. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

A barrier layer 134 and a first metal layer 136 may be sequentially formed on the lower conductive layer 132. In example embodiments, the first metal layer 136 may include, e.g., tungsten.

A second capping layer 140 may be formed on the first metal layer 136. In example embodiments, the second capping layer 140 may include silicon nitride.

Figure 7:
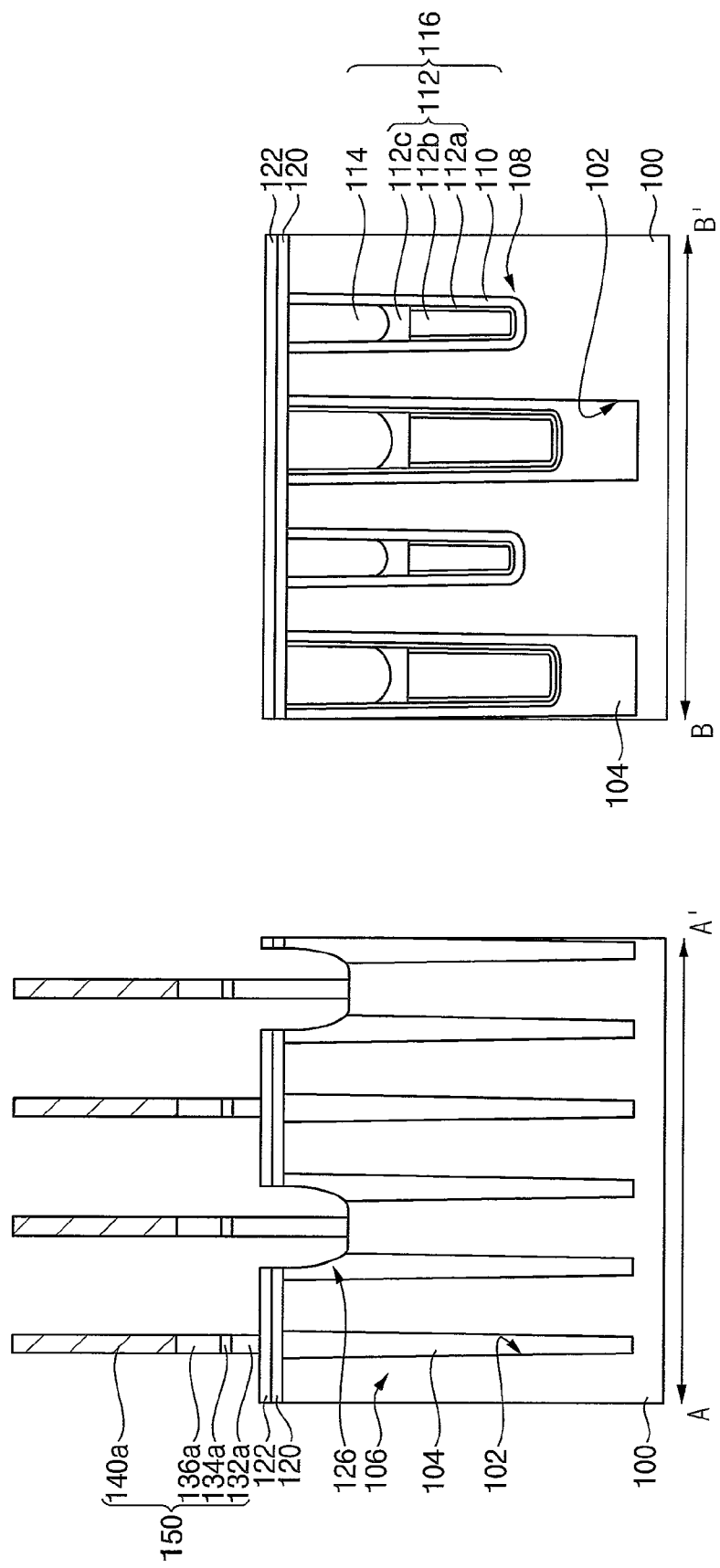

Referring to FIG. 7, a first etching mask pattern (not shown) may be formed on the second capping layer 140. A process for forming the first etching mask pattern may include a photolithography process.

The second capping layer 140 may be etched using the first etching mask patterns as an etching mask to form a second capping layer pattern 140a. The second capping layer pattern 140a may serve as an etching mask for forming a bit line structure.

The first metal layer 136, the barrier layer 134 and the lower conductive layer 132 may be sequentially etched using the second capping layer pattern 140a as an etching mask to form the bit line structure 150. The bit line structure 150 may include a lower conductive pattern 132a, a barrier layer pattern 134a, a first metal pattern 136a, and a second capping layer pattern 140a sequentially stacked.

The bit line structures 150 may have a line shape extending in the first direction. A plurality of bit line structures 150 may be arranged in the second direction, and may be spaced apart from each other by regular spacing.

A first portion of a bottom of the bit line structure 150 may contact the upper surface of the active pattern 106. The bit line structure 150 may contact the active pattern 106 exposed by the bottom of the first opening 126. A second portion of the bottom of the bit line structure 150 may contact an upper surface of the second buffer insulation layer 122.

Figure 8:
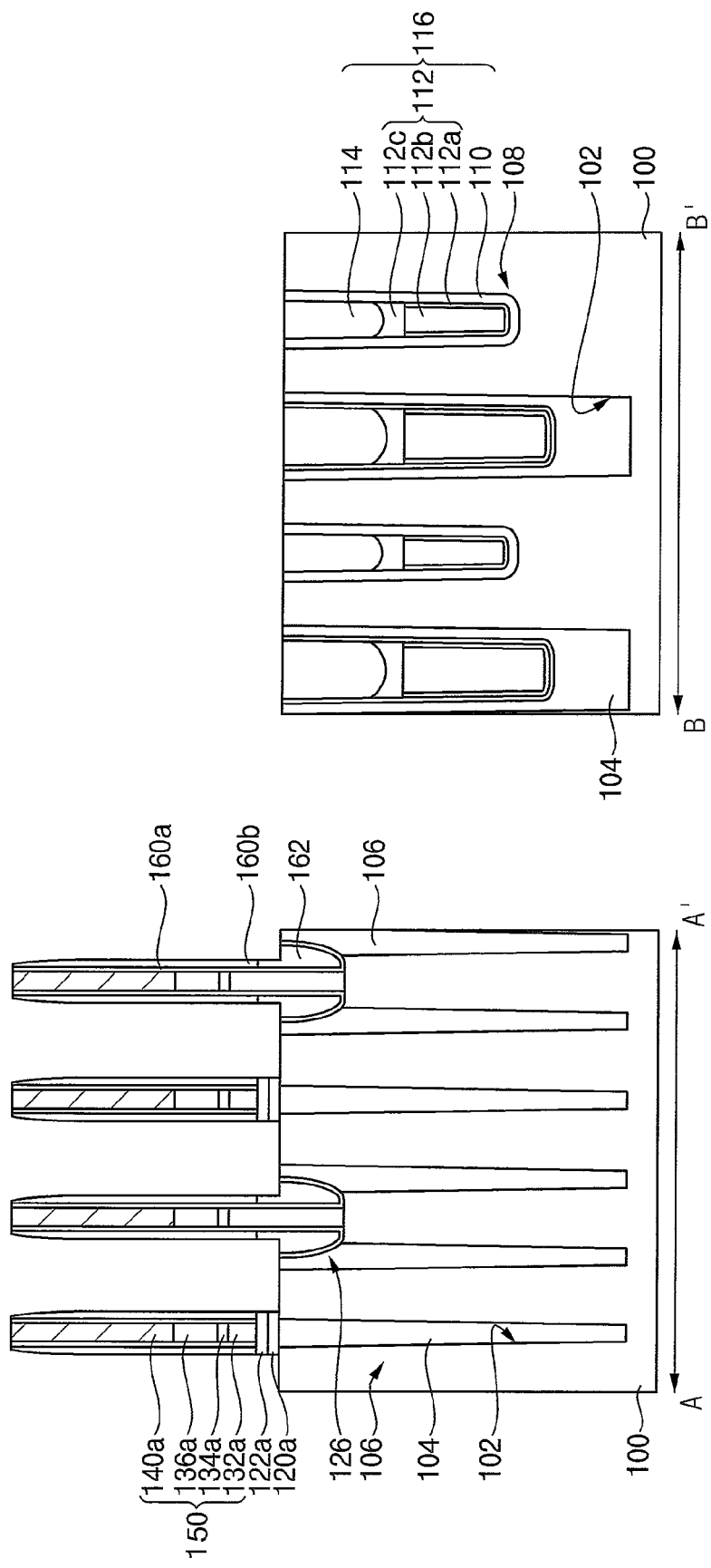

Referring to FIG. 8, a first spacer layer may be conformally formed on the substrate 100 on which the bit line structure 150 is formed. A lower insulation layer may be sequentially formed on the first spacer layer. The lower insulation layer may completely fill a remaining portion of the first opening 126.

The first spacer layer may include or may be formed of, e.g., a nitride such as silicon nitride. The lower insulation layer may include or may be formed of, e.g., a silicon oxide layer and a silicon nitride layer.

Thereafter, the lower insulation layer may be etched by an etching process. In example embodiments, the etching process may be performed by a wet etching process using, e.g., phosphoric acid (H2PO3), standard clean 1 (SC1) solution, and hydrofluoric acid (HF) as an etchant. The lower insulation layer except for a portion of filling the first opening 126 may be completely removed by the etching process to form a lower insulation pattern 162 filling the first opening 126. Accordingly, most of the surface of the first spacer layer (for example, all portions of the first spacer layer other than the portion filling the first opening 126) may be exposed. The lower insulation layer formed in the first opening 126 may serve as the lower insulation pattern 162.

Thereafter, a second spacer layer may be formed on exposed surfaces of the first spacer layer and the lower insulation patterns 162. The second spacer layer may be anisotropically etched to form a second spacer 160b on the surface of the first spacer layer and on the lower insulation pattern 162 to cover a sidewall of the bit line structure 150. The second spacer layer may include or may be formed of, e.g., an oxide such as silicon oxide.

Thereafter, a dry etching process using the second capping layer pattern 140a and the second spacer 160b as an etching mask may be performed to expose the upper surface of the active pattern 106. In this case, the upper surface of the isolation pattern 104 and the upper surface of the first capping layer pattern 114 may also be exposed.

By the dry etching process, portions of the first spacer layer formed on the upper surfaces of the second capping layer pattern 140a and the second buffer insulation layer 122 may be removed to form a first spacer 160a. The first spacer 160a may cover the sidewall of the bit line structure 150. In the dry etching process, the first and second buffer insulation layers 120 and 122 may be also partially removed to form the first and second buffer insulation patterns 120a and 122a under each of the bit line structures 150.

Figure 10:
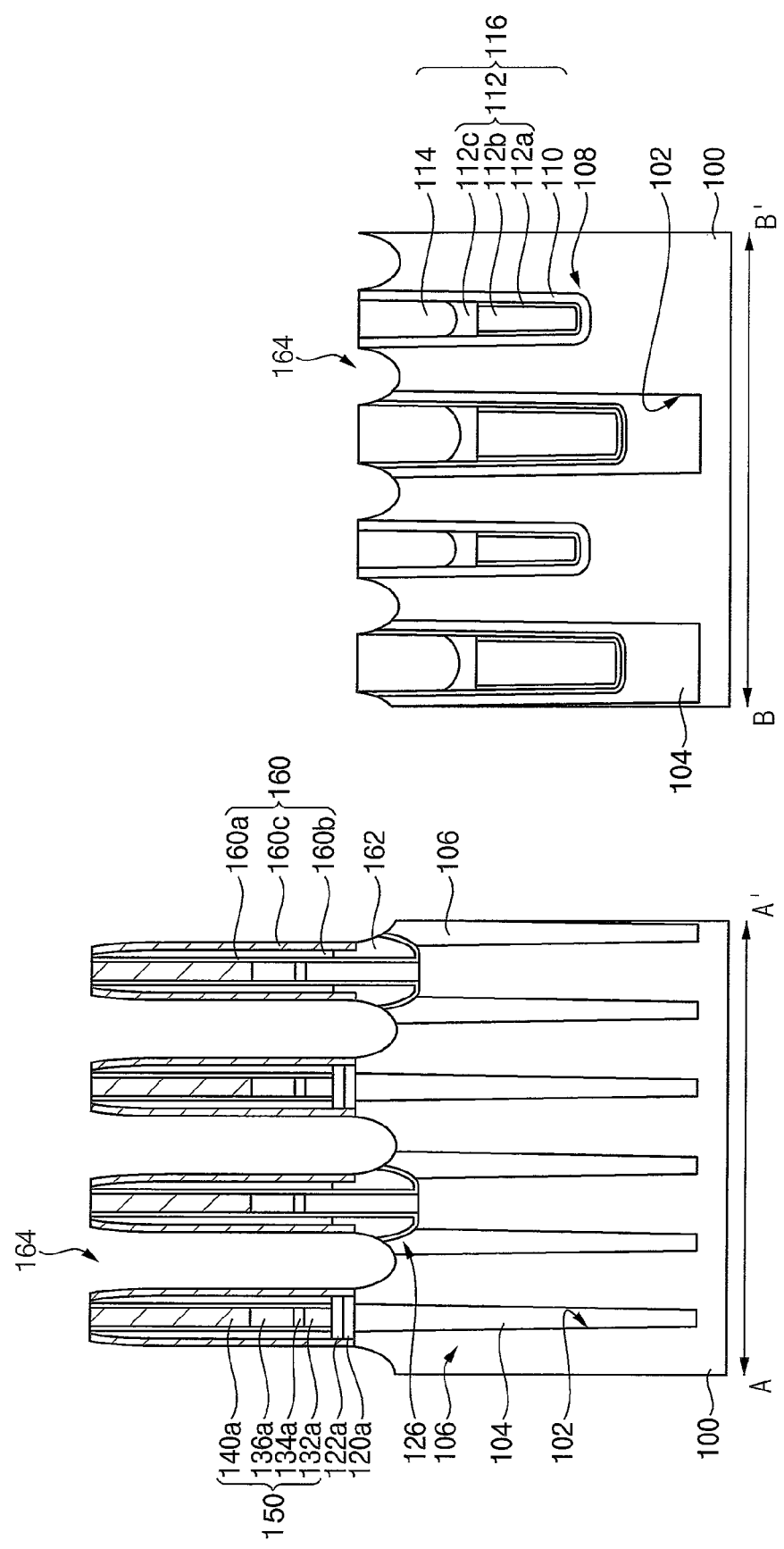

Referring to FIGS. 9 and 10, a third spacer layer may be formed on an upper surface of the second capping layer pattern 140a, an outer wall of the second spacer 160b, an upper surface of the lower insulation pattern 162, and the upper surfaces of the active pattern 106, the isolation pattern 104 and the first capping layer pattern 114. The third spacer layer may be anisotropically etched to form a third spacer 160c covering the sidewall of the bit line structure 150. The third spacer layer may include or may be formed of, e.g., a nitride such as silicon nitride.

Thereafter, the active pattern 106 between the third spacers 160c may be additionally etched to form a second opening 164 exposing the active pattern 106. The second opening 164 may be positioned between the bit line structures 150. The active pattern 106 between the bit line structures 150 may be exposed by the second opening 164. In the etching process, an upper portion of the isolation pattern 104 adjacent to the active pattern 106 may also be partially etched. Therefore, a portion of the isolation pattern 104 may be exposed by a bottom of the second opening 164.

The first to third spacers 160a, 160b and 160c may be sequentially stacked on the sidewall of the bit line structure 150 in a horizontal direction parallel to the upper surface of the substrate 100. The first to third spacers 160a, 160b and 160c are referred to as a spacer structure 160. Although the spacer structure 160 including the first to third spacers 160a, 160b, and 160c is described, the number and materials of spacers stacked in the spacer structure 160 may not be limited thereto.

Figure 11:
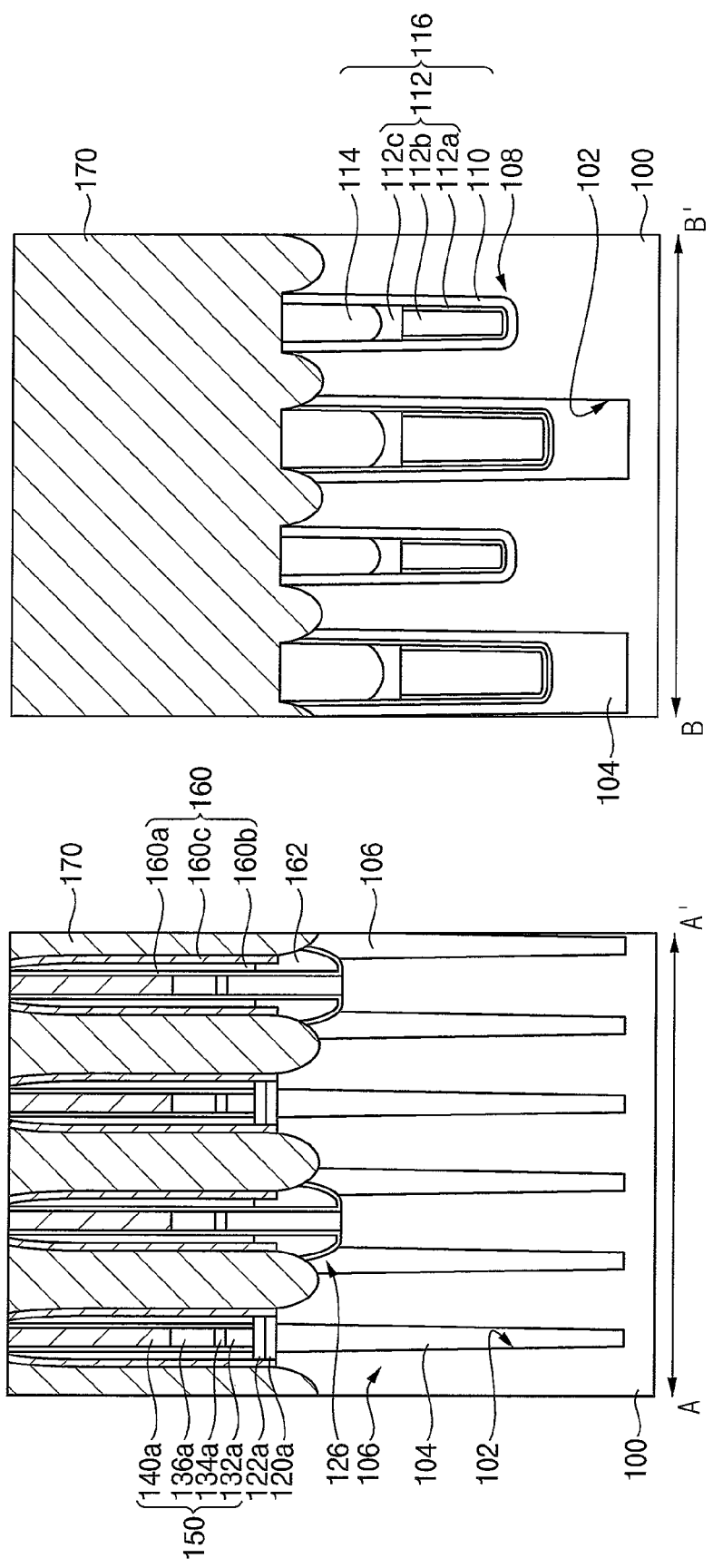

Referring to FIG. 11, a third conductive layer may be formed to fill the second opening 164. An upper portion of the third conductive layer may be planarized until an upper surface of the second capping layer pattern 140a may be exposed to form a preliminary conductive pattern 170. The preliminary conductive pattern 170 may extend in the first direction, and may be formed between the bit line structures 150.

The preliminary conductive pattern 170 may include or may be formed of, e.g., polysilicon doped with impurities.

Figure 13:
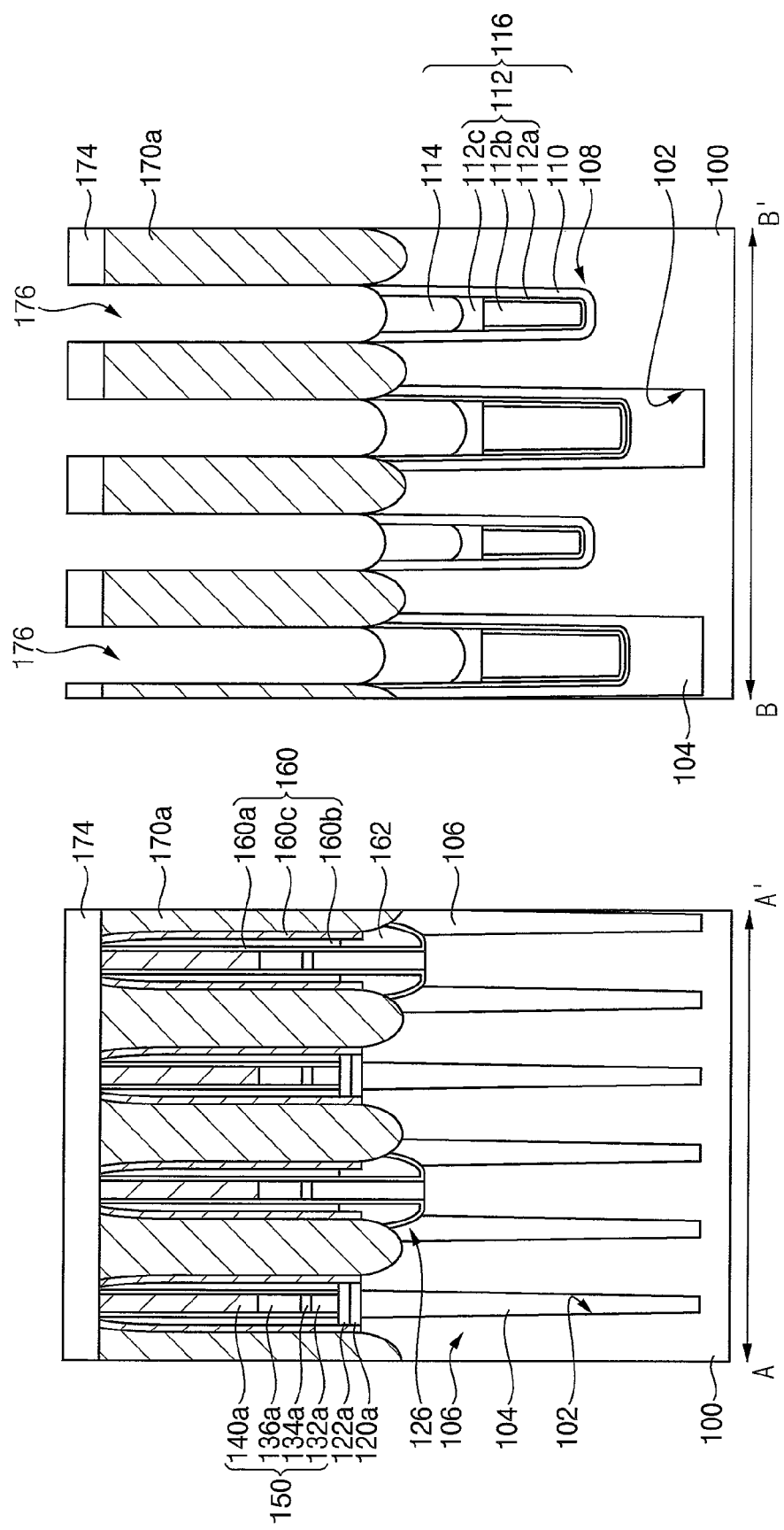

Referring to FIGS. 12 and 13, second etching mask patterns 174 may be formed on the second capping layer pattern 140a, the spacer structure 160 and the preliminary conductive pattern 170. Each of the second etching mask patterns 174 may extend in the second direction. The second etching mask patterns may be spaced apart from each other in the first direction. A trench may be formed between the second etching mask patterns 174.

In example embodiments, each of trenches may overlap the gate structure 116 in the vertical direction (i.e., fourth direction). For example, each of the trenches may be positioned over the gate structure 116.

The preliminary conductive pattern 170 may be etched using the second etching mask pattern 174. In the etching process, the second capping layer pattern 140a and the spacer structure 160 may not be etched.

A portion of the preliminary conductive pattern 170 exposed by the trench between the bit line structures 150 may be selectively etched. Therefore, the preliminary conductive patterns 170 may be spaced apart from each other in the first direction, so that preliminary contact plugs 170a may be formed. A bottom of each of the preliminary contact plugs 170a may contact the active pattern 106.

A third opening 176 may be formed between the preliminary contact plugs 170a. An upper surface of the first capping layer pattern 114 in the gate structure 116 may be exposed by a bottom of the third opening 176.

As shown in FIG. 3, a sidewall of each of corners of the third opening 176 formed by the above process may have a rounded shape.

Figure 14:
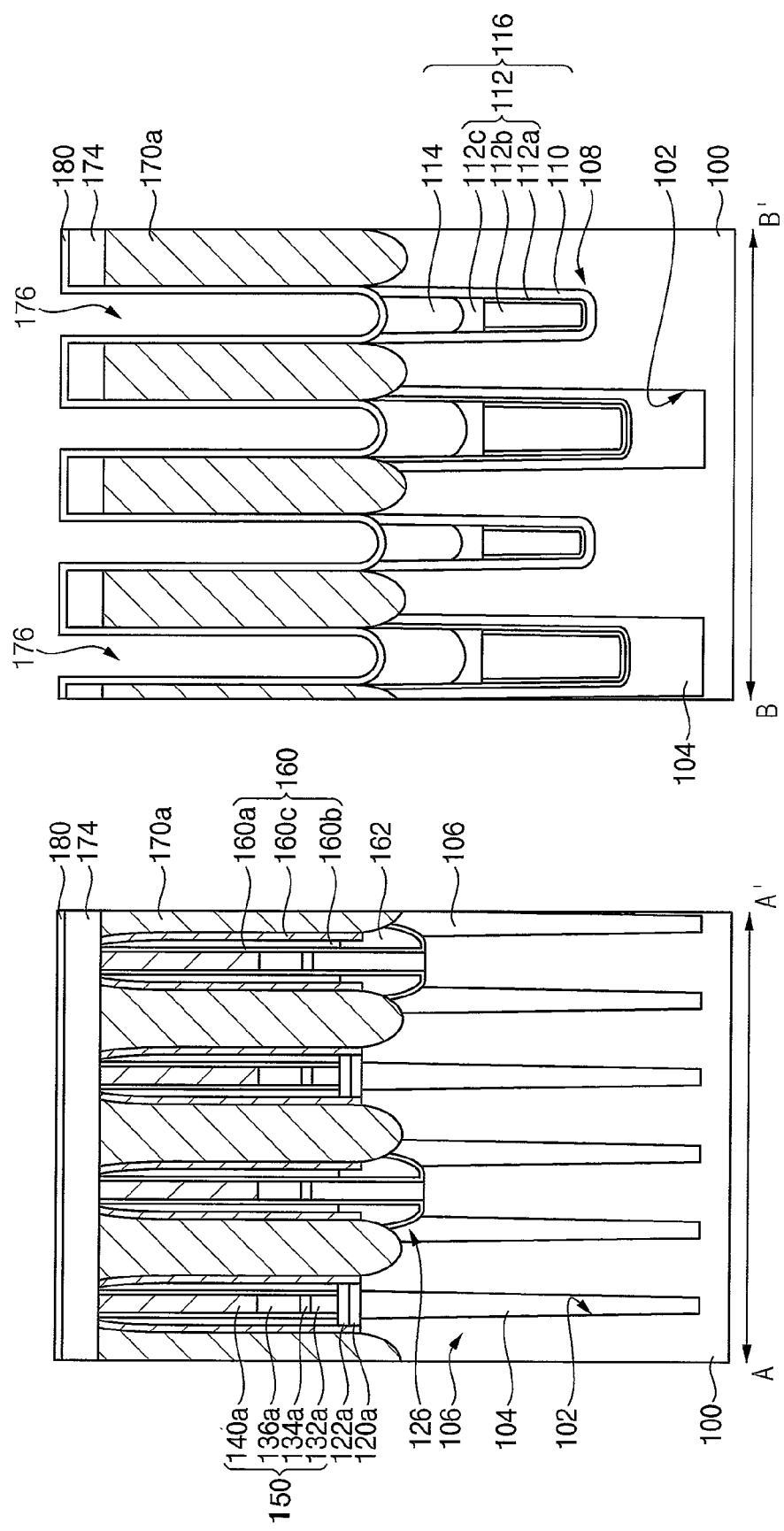

Referring to FIG. 14, a barrier insulation layer 180 may be conformally formed on a surface of the third opening 176 and a surface of the second etching mask pattern 174. The barrier insulation layer 180 may be formed by a deposition process. In example embodiments, the barrier insulation layer 180 may be formed by an atomic layer deposition (ALD) process or a chemical vapor deposition (CVD) process.

Although not shown, when the sidewall of each of corners of the third opening 176 has the rounded shape in a plan view, the barrier insulation layer may be folded at the rounded corner portions of the third opening 176 during the deposition process. Therefore, the barrier insulation layer may have a relatively thick thickness at the rounded corner portions.

The barrier insulation layer 180 may include a material having a band gap higher than a band gap of a fence insulation layer completely filling the third opening 176 subsequently formed. In example embodiments, the barrier insulation layer 180 may include a material having a band gap higher than that of silicon nitride. For example, the barrier insulation layer 180 may include or may be formed of aluminum nitride, silicon oxide, aluminum oxide, aluminum oxynitride, silicon oxynitride, BN, or the like.

Figure 15:
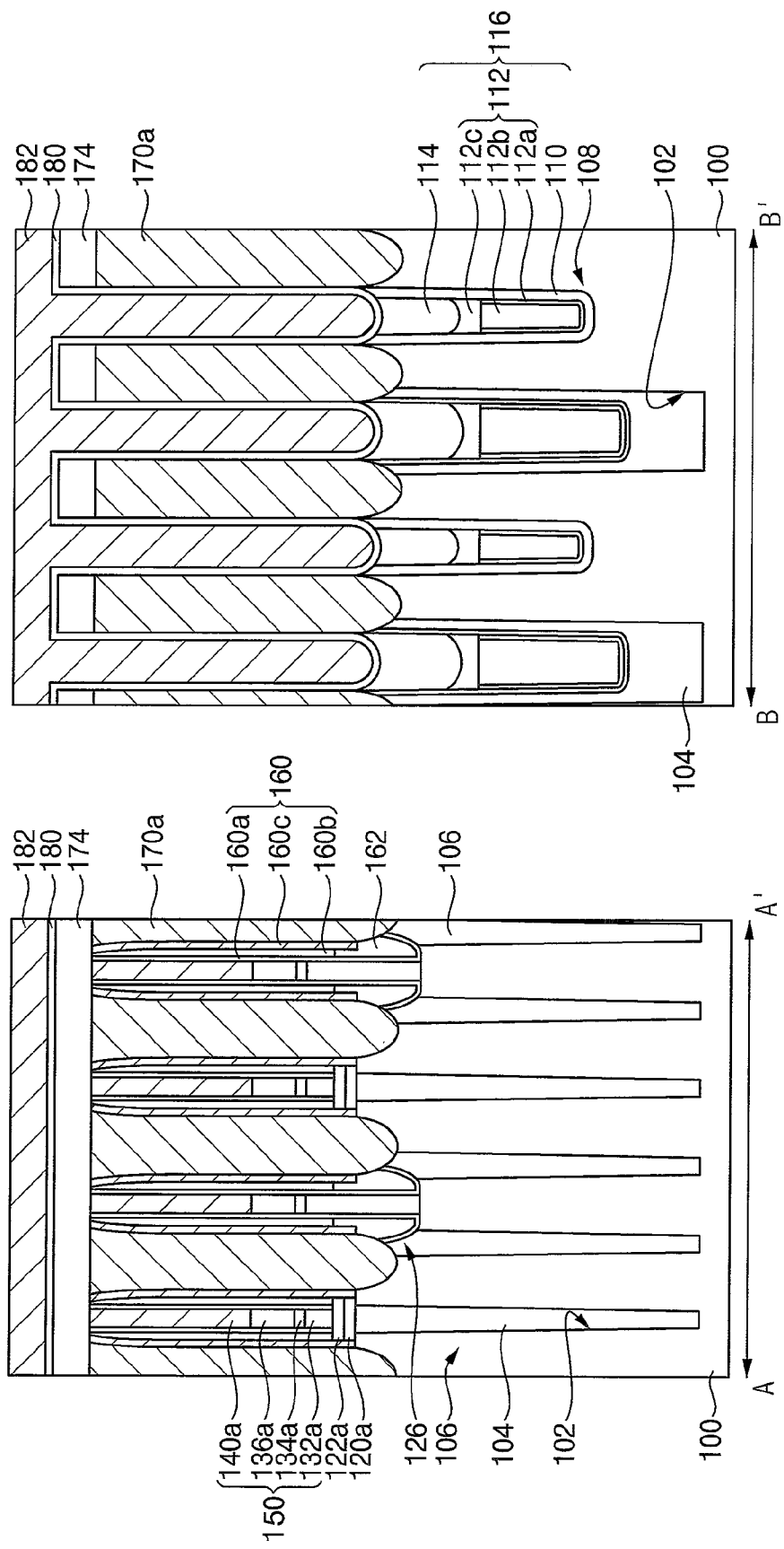

Referring to FIG. 15, the fence insulation layer 182 may be formed on the barrier insulation layer 180 to completely fill the third opening 176. The fence insulation layer 182 may be formed by a deposition process. In example embodiments, the fence insulation layer 182 may be formed by an ALD process or a CVD process.

The fence insulation layer 182 may include a material having an etch selectivity with respect to silicon oxide. In example embodiments, the fence insulation layer 182 may include silicon nitride. In some example embodiments, the fence insulation layer may include or may be formed of SiOCN, BN, or SiOC having a dielectric constant lower than that of silicon nitride.

In example embodiments, when deposition temperature ranges of the barrier insulation layer 180 and the fence insulation layer 182 are similar or the same, the barrier insulation layer 180 and the fence insulation layer 182 may be formed in situ. For example, when the barrier insulation layer 180 is formed of aluminum nitride and the fence insulation layer 182 is formed of silicon nitride, the barrier insulation layer 180 and the fence insulation layer 182 may be formed in situ.

In some example embodiments, when the deposition temperature ranges of the barrier insulation layer 180 and the fence insulation layer 182 are different, the barrier insulation layer 180 and the fence insulation layer 182 may be formed ex situ. For example, when the barrier insulation layer 180 is formed of aluminum oxide or BN and the fence insulation layer 182 is formed of silicon nitride, the barrier insulation layer 180 and the fence insulation layer 182 may be formed ex situ.

In example embodiments, before forming the fence insulation layer 182, a pre-cleaning process may be further performed to control an interface resistance between the barrier insulation layer 180 and the fence insulation layer 182.

In example embodiments, a heat treatment process may be further performed after forming the barrier insulation layer 180 and/or after forming the fence insulation layer 182. An etching endurance and an insulation property of each of the barrier insulation layer 180 and the fence insulation layer 182 may be controlled by the heat treatment process.

Figure 17:
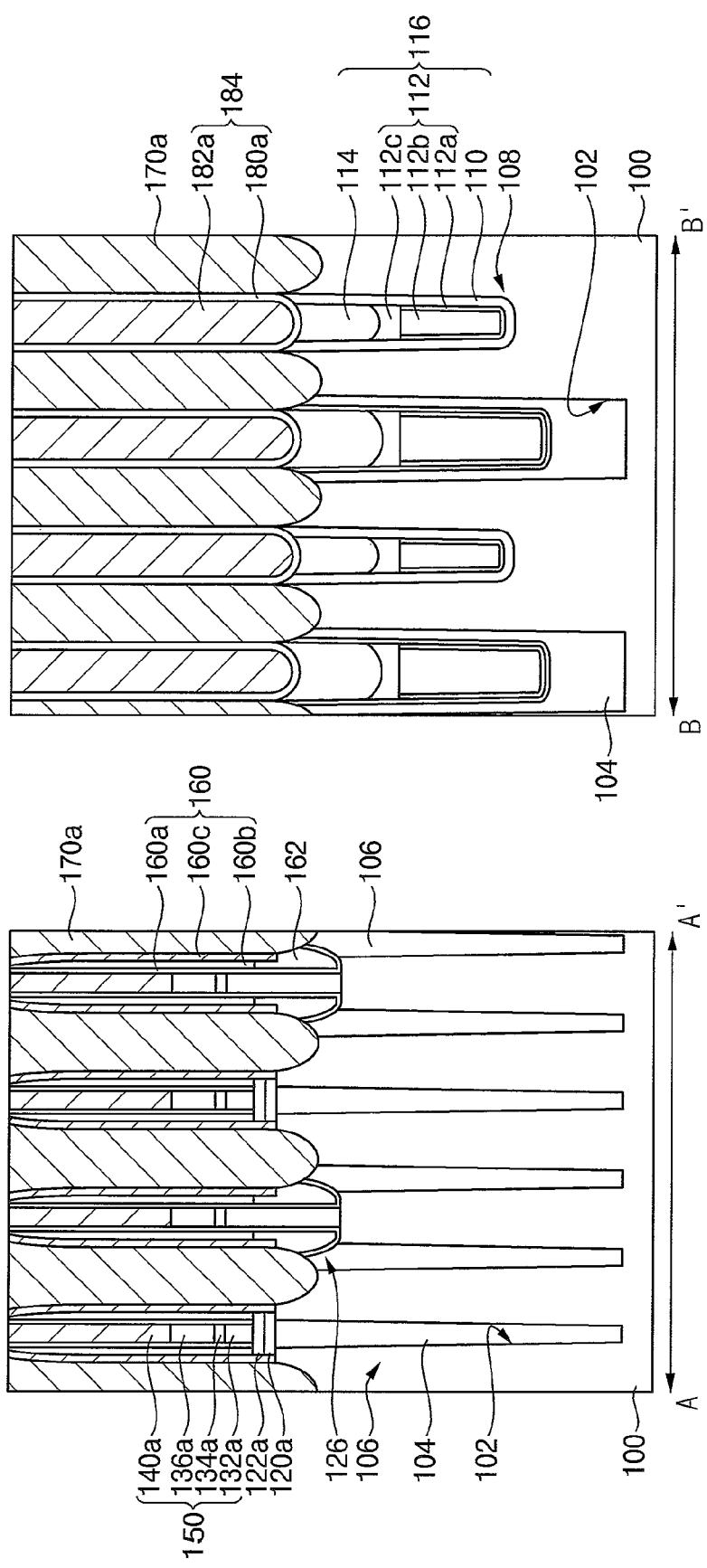

Referring to FIGS. 16 and 17, the fence insulation layer 182, the barrier insulation layer 180 and the second etching mask pattern 174 may be planarized until an upper surface of the second capping layer pattern 140a may be exposed to form a fence insulation structure 184 in the third opening 176. The fence insulation structure 184 may include a barrier insulation pattern 180a and a fence insulation pattern 182a. The barrier insulation pattern 180a may completely surround a sidewall and a bottom of the fence insulation pattern 182a. The barrier insulation pattern 180a may contact a portion of outer sidewall of the preliminary contact plug 170a.

The preliminary contact plugs 170a spaced apart from each other in the first direction may be insulated from each other by the fence insulation structure 184.

As described with reference to FIGS. 14 to 17, the barrier insulation pattern 180a may be formed by a deposition process.

Figure 18:
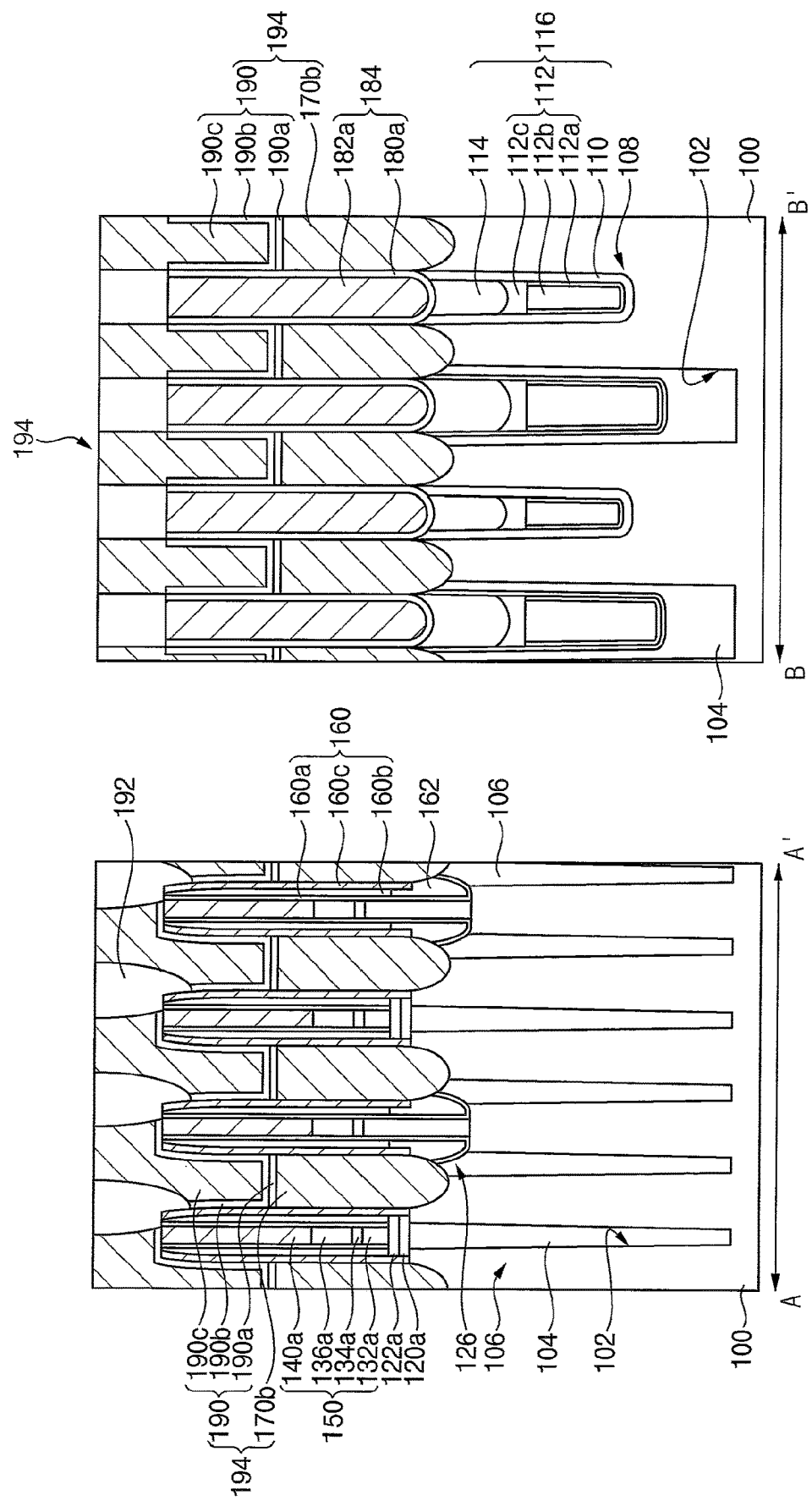

Referring to FIG. 18, an upper portion of the preliminary contact plug 170a may be etched to form a lower contact plug 170b. An opening defined by the bit line structure 150 and the fence insulation structure 184 may be formed on the lower contact plug 170b.

A second upper conductive layer may be formed on the lower contact plug 170b to fill the opening. The second upper conductive layer may have an upper surface higher than the upper surface of the bit line structure 150. The second upper conductive layer may include a metal. For example, the metal may include tungsten.

Thereafter, a portion of the second upper conductive layer may be etched to form an upper contact plug 190 on the lower contact plug 170b. A fourth opening between upper portions of the upper contact plugs 190 may be also formed by the etching process of the second upper conductive layer.

A stacked structure including the lower contact plug 170b and the upper contact plug 190 may serve as a contact plug structure 194. An upper insulation pattern 192 may be formed to fill the fourth opening.

In example embodiments, the second upper conductive layer may include a metal silicide pattern, a barrier metal layer, and a metal layer. In this case, the upper contact plug 190 may include a metal silicide pattern 190a, a barrier metal pattern 190b, and a metal pattern 190c.

In some example embodiments, most of the preliminary contact plug 170a may be etched, so that the opening may have a height higher than a height of the lower contact plug 170b in the fourth direction. In this case, the upper contact plug 190 including the metal may have a height higher than a height of the lower contact plug 170b including the polysilicon.

In some example embodiments, all of the preliminary contact plug 170a may be etched, and then the second upper conductive layer may be formed in the opening. In this case, for example, the contact plug structure may include a metal silicide pattern, a barrier metal pattern, and a metal pattern.

In some example embodiments, the preliminary contact plug 170a may not be etched, so that a contact plug structure including only polysilicon may be formed.

Figure 19:
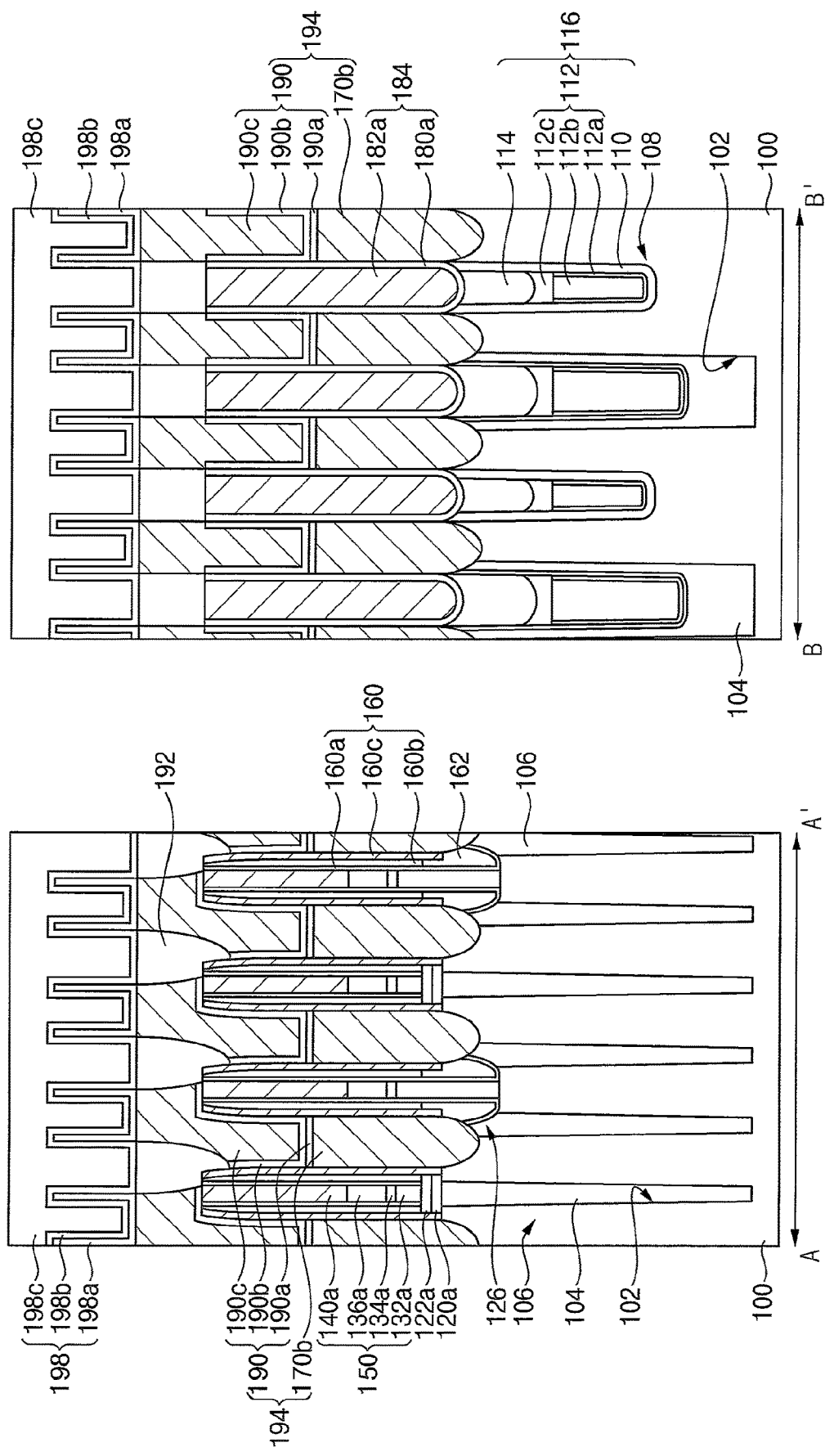

Referring to FIG. 19, a capacitor 198 may be formed on the upper contact plug 190. The capacitor 198 may contact a surface of the upper contact plug 190

The capacitor 198 may include a lower electrode 198a, a dielectric layer 198b and an upper electrode 198c stacked.

As the above processes are performed, a DRAM device may be manufactured.

Figure 20:
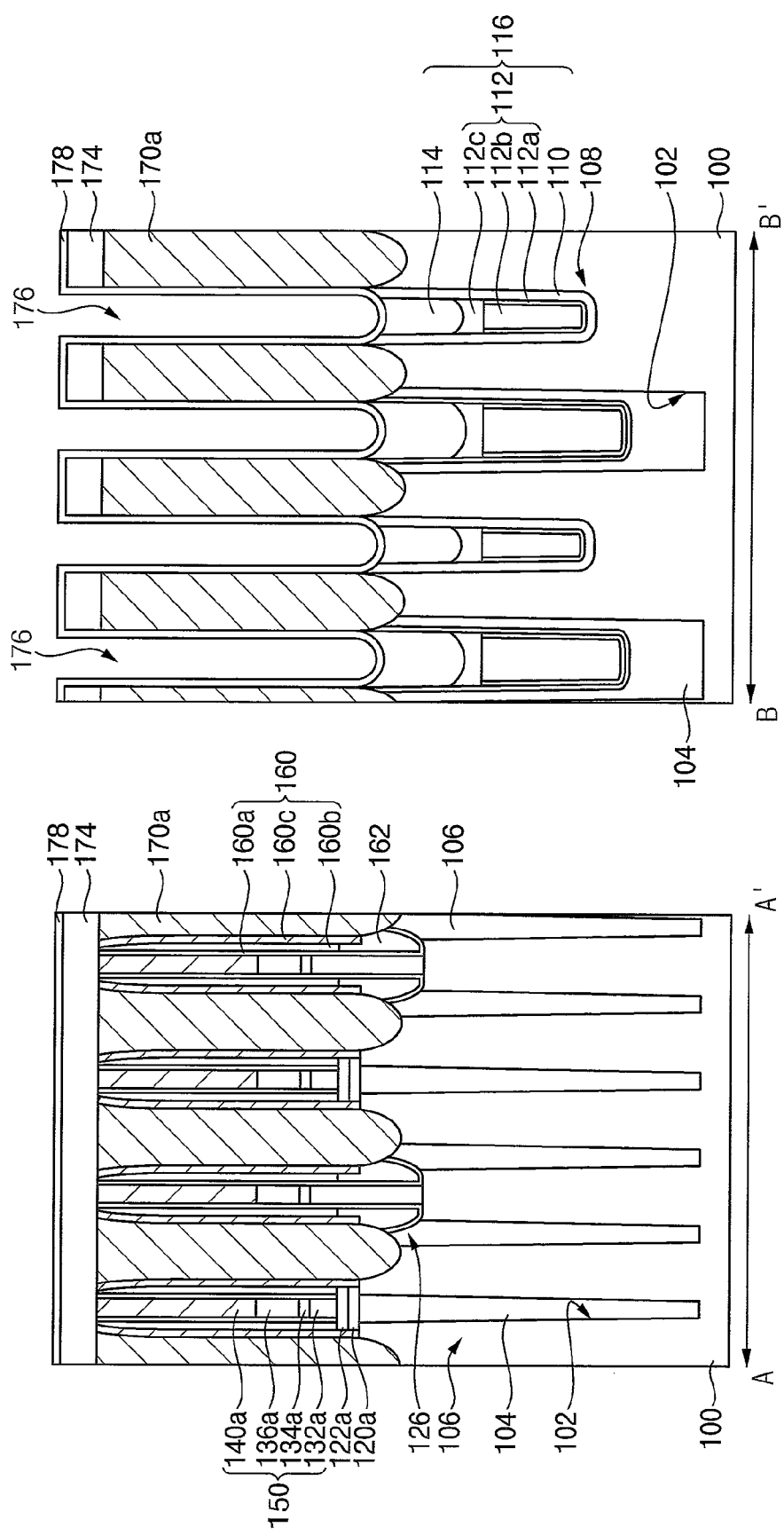
Figure 21:
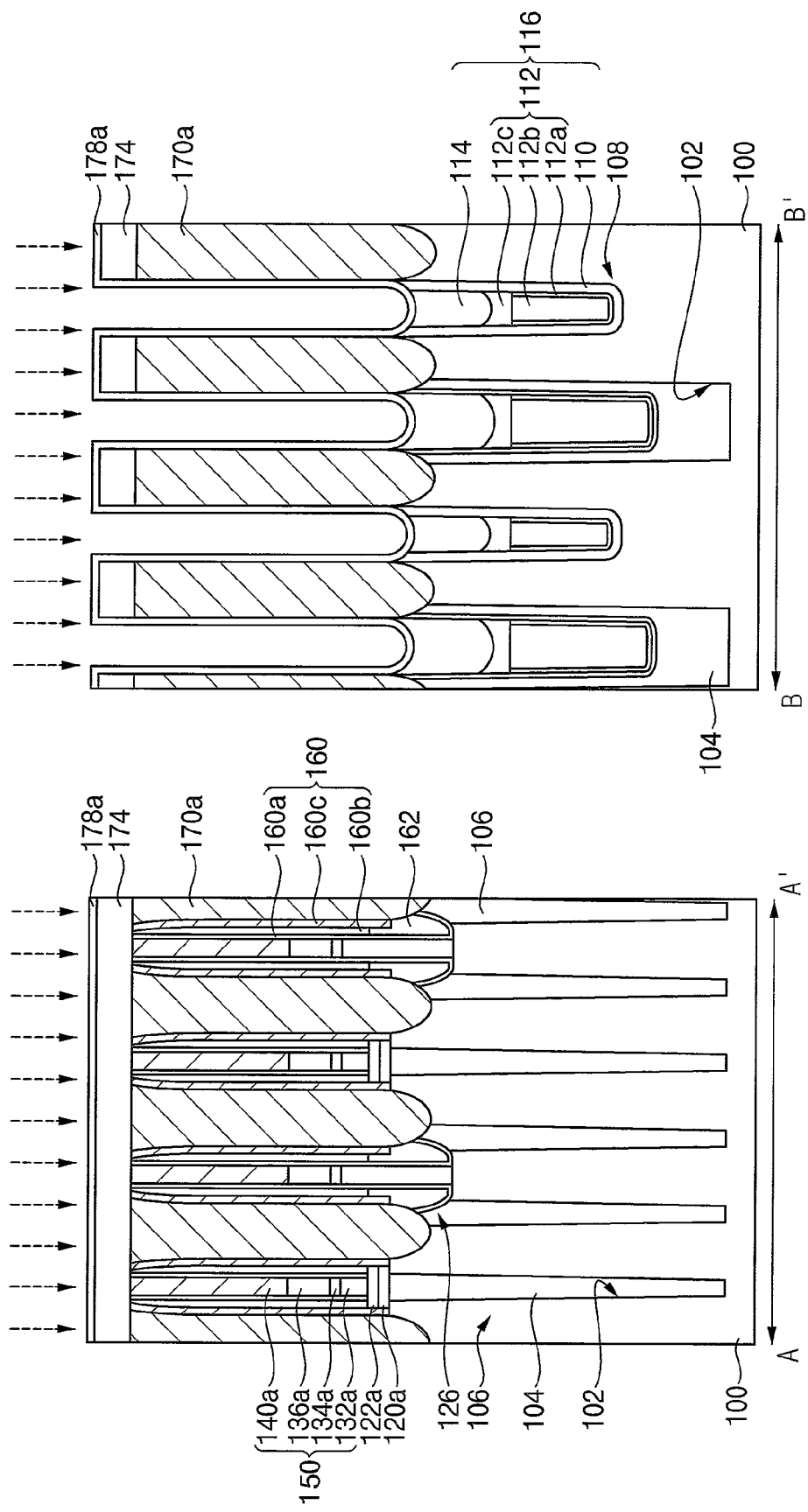

FIGS. 20 and 21 are cross-sectional views illustrating a method for manufacturing a semiconductor device in accordance with example embodiments.

The method for manufacturing the semiconductor device includes processes substantially the same as or similar to those described with reference to FIGS. 4 to 19, except for the method for forming the fence insulation structure. Therefore, redundant description thereof may be omitted.

Referring to FIG. 20, processes substantially the same as or similar to those described with reference to FIGS. 1 to 13 may be performed. Thereafter, a preliminary barrier insulation layer 178 may be conformally formed on a surface of the third opening 176 and a surface of the second etching mask pattern 174. The preliminary barrier insulation layer 178 may be formed by a deposition process. In example embodiments, the preliminary barrier insulation layer 178 may be formed by an ALD process or a CVD process.

The preliminary barrier insulation layer 178 may include or may be formed of silicon nitride.

Referring to FIG. 21, the preliminary barrier insulation layer 178 may be doped with aluminum to form a barrier insulation layer 178a. In this case, the barrier insulation layer 178a may include aluminum-doped silicon nitride. The doping process may include an ion implantation process.

In some example embodiments, the preliminary barrier insulation layer 178 may be oxidized to form a barrier insulation layer 178a. In this case, the barrier insulation layer 178a may include silicon oxide or silicon oxynitride. The oxidation process may include a radical oxidation process.

In some example embodiments, the preliminary barrier insulation layer 178 may be doped with aluminum, and then oxidized to form the barrier insulation layer 178a. In this case, the barrier insulation layer 178a may be aluminum-doped silicon oxynitride.

As described above, in order to form the barrier insulation layer 178a having a band gap higher than a band gap of the fence insulation layer, a silicon nitride layer having a thin thickness may be formed. Then, the silicon nitride layer may be doped with impurities, or may be oxidized.

Thereafter, processes substantially the same as or similar to those described with reference to FIGS. 15 to 19 may be performed, so that the semiconductor device may be manufactured.

FIGS. 22 to 27 are cross-sectional views illustrating a method of manufacturing a semiconductor device in accordance with example embodiments.

The method for manufacturing the semiconductor device includes processes substantially the same as or similar to those described with reference to FIGS. 4 to 19. Therefore, redundant description thereof may be omitted. In the following method, first, the fence insulation structure may be formed, and then the contact plug structure may be formed.

Figure 22:
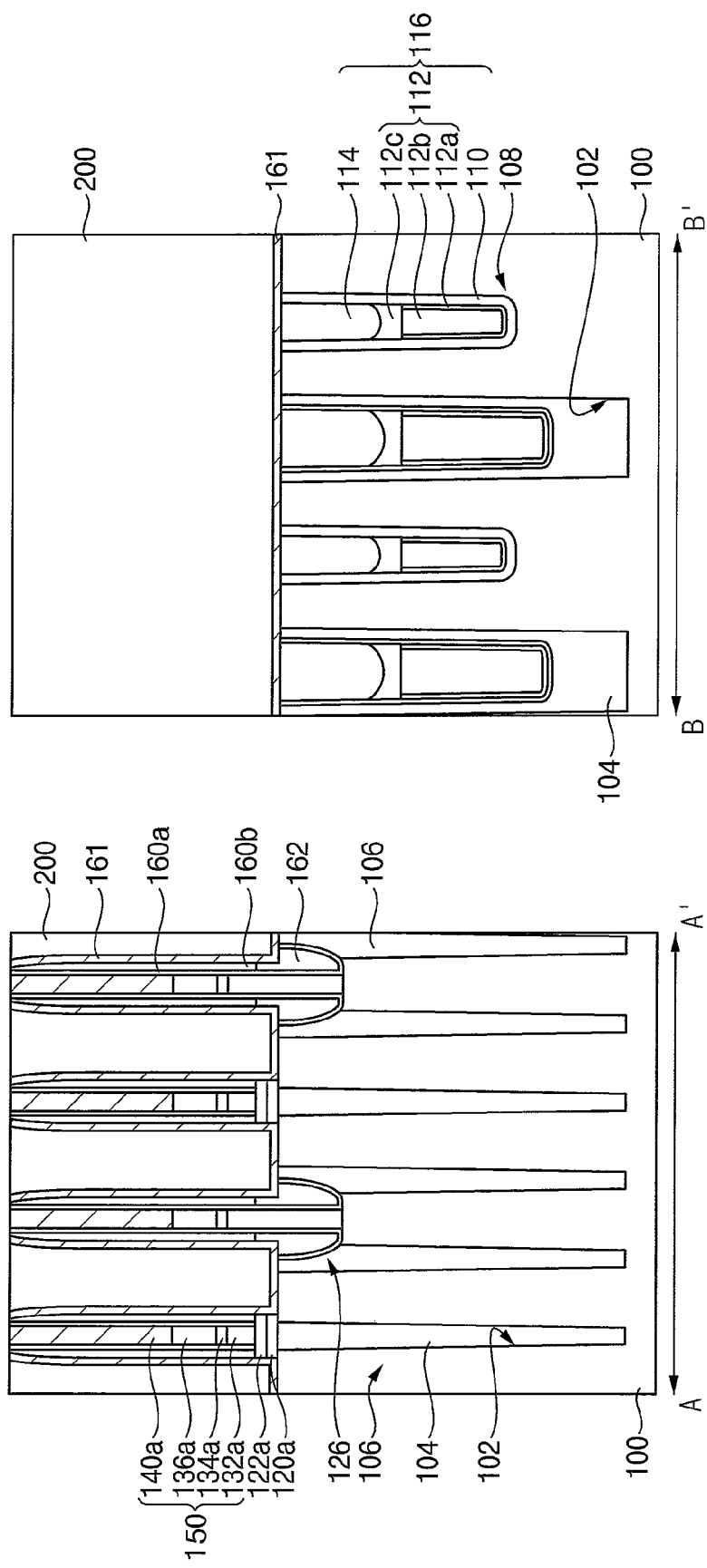

Referring to FIG. 22, first, processes substantially the same as or similar to those described with reference to FIGS. 4 to 8 may be performed.

Thereafter, a third spacer layer 161 may be formed on an upper surface of the second capping layer pattern 140a, an outer wall of the second spacer 160b, upper surfaces of the lower insulation pattern 162, the active pattern 106, the isolation pattern 104 and the first capping layer pattern 114.

A filling insulation layer 200 may be formed on the third spacer layer 161 to fill a gap between the third spacer layers 161. Thereafter, the filling insulation layer 200 may be planarized until the second capping layer pattern 140a may be exposed at an upper surface of the filling insulation layer 200. The filling insulation layer 200 may include silicon oxide. For example, the filling insulation layer 200 may include a Tone SilaZene (TOSZ) material.

Figure 23:
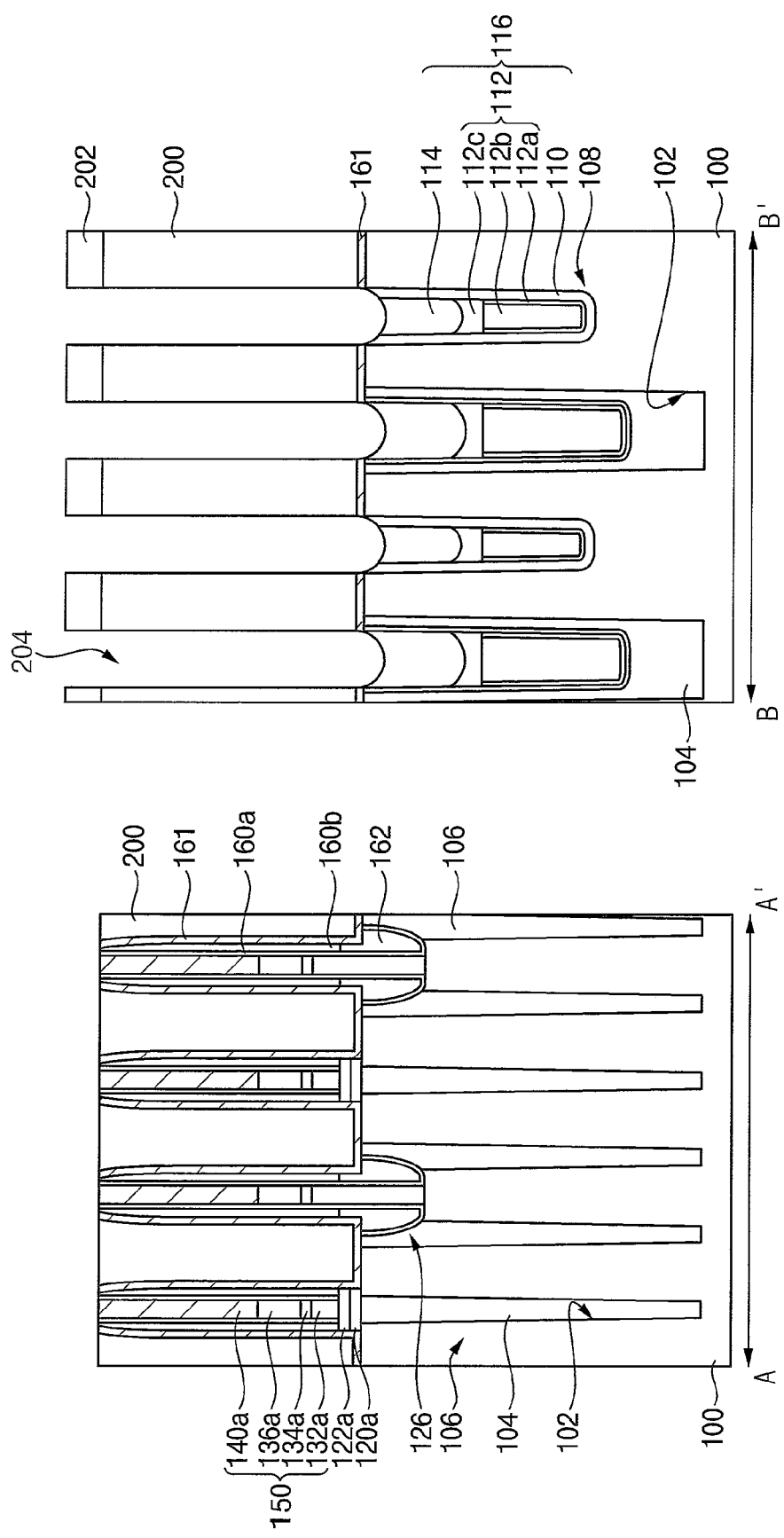

Referring to FIG. 23, an etching mask pattern 202 for forming the fence insulation pattern may be formed on the filling insulation layer 200 and the second capping layer pattern 140a. The etching mask pattern 202 may selectively expose a region for forming the fence insulation pattern. A process for forming the etching mask pattern 202 may include a photolithography process.

The etching mask pattern 202 may have a line shape extending in the second direction. A plurality of etching mask patterns 202 may be arranged in the first direction, and may be spaced apart from each other by regular spacing. The etching mask pattern 202 may expose a portion corresponding to the gate structure 116.

The filling insulation layer 200 may be etched using the etching mask pattern 202 as an etching mask to form a second opening 204. In a process for forming the second opening 204, upper portions of the third spacer layer 161 and the first capping layer pattern 114 may be partially etched together.

The second opening 204 may vertically overlap the gate structure 116 in the fourth direction. The etching mask pattern 202 may be removed.

Figure 24:
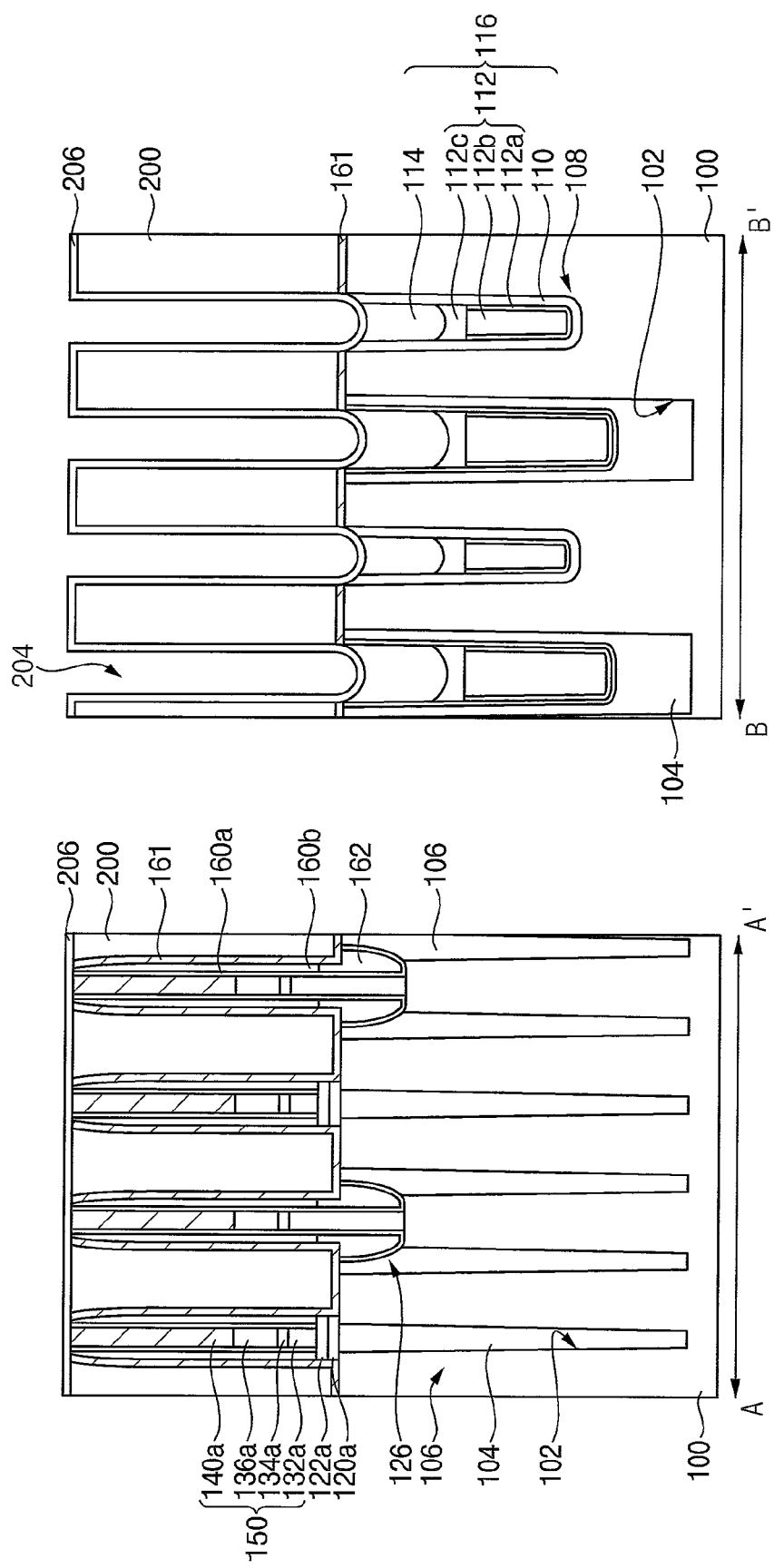

Referring to FIG. 24, a barrier insulation layer 206 may be conformally formed on the filling insulation layer 200, the second capping layer pattern 140a and the third spacer layer 161. The barrier insulation layer 206 may be conformally formed along a surface of the second opening 204. The barrier insulation layer 206 may be formed by a deposition process. In example embodiments, the barrier insulation layer 206 may be formed by an ALD process or a CVD process.

The barrier insulation layer 206 may include a material having a band gap higher than a band gap of a fence insulation layer subsequently formed. For example, the barrier insulation layer 206 may include or may be formed of aluminum nitride, silicon oxide, aluminum oxide, aluminum oxynitride, silicon oxynitride, or BN.

Figure 25:
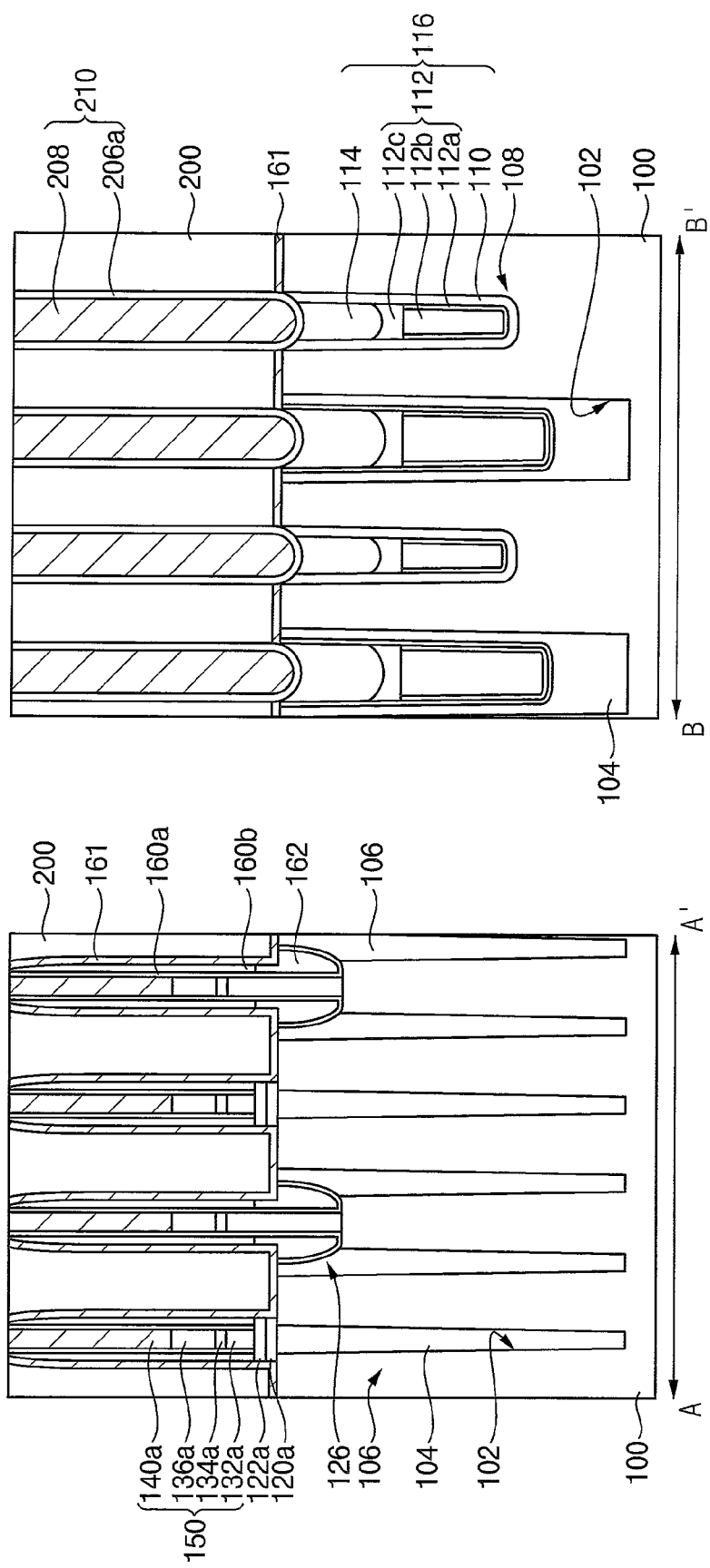

Referring to FIG. 25, the fence insulation layer may be formed on the barrier insulation layer 206 to fill the second opening 204. The fence insulation layer may include or may be formed of, e.g., silicon nitride.

Thereafter, the fence insulation layer and the barrier insulation layer 206 may be planarized until upper surfaces of the filling insulation layer 200 and the second capping layer pattern 140a may be exposed to form a fence insulation structure 210 in the second opening 204. The fence insulation structure 210 may include a barrier insulation pattern 206a and a fence insulation pattern 208. Accordingly, the filling insulation layer 200 may have an isolated pattern shape by the bit line structure 150 and the fence insulation structure 210.

Figure 26:
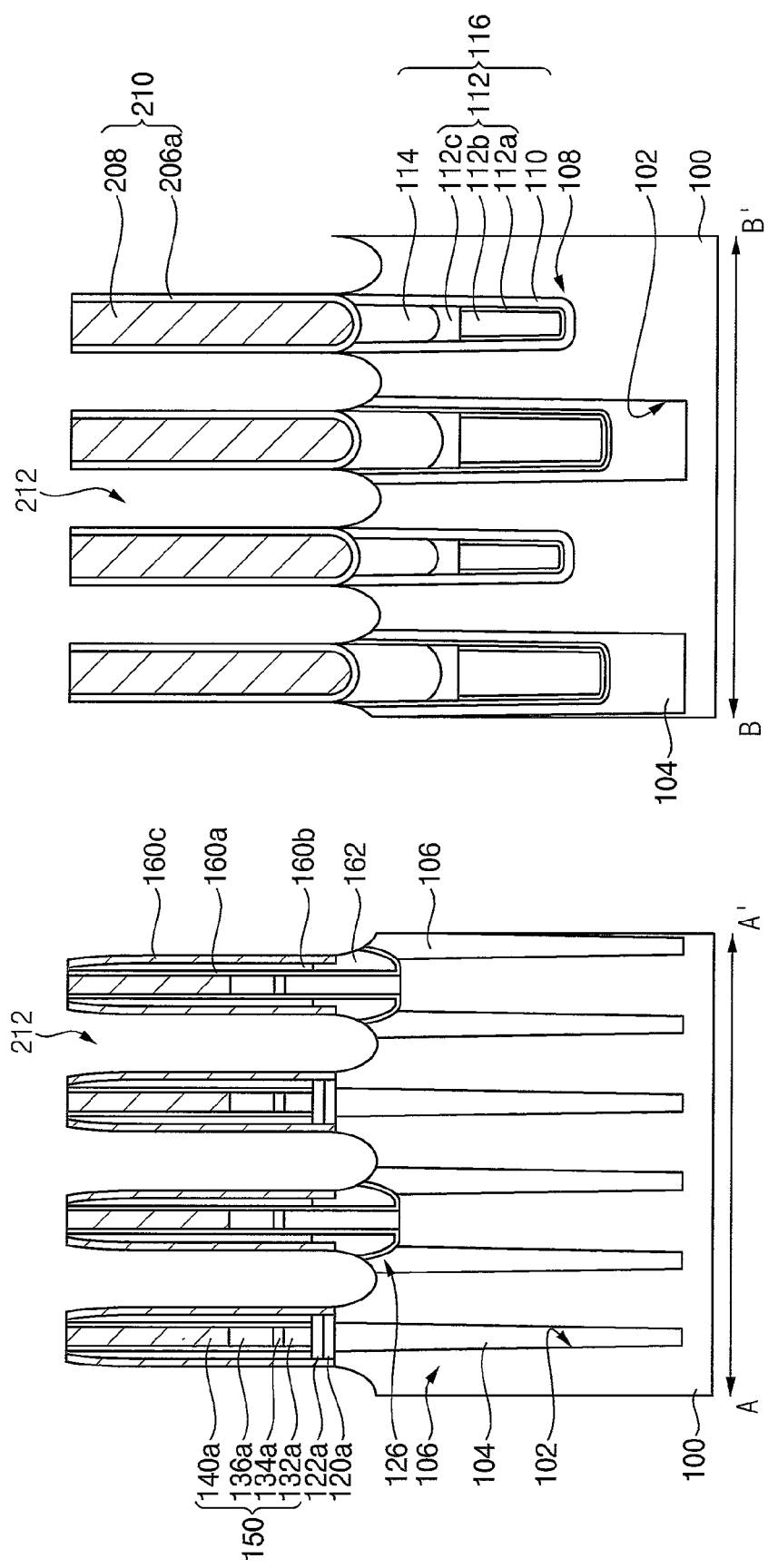

Referring to FIG. 26, the filling insulation layer 200 may be removed to form a preliminary contact hole. Thereafter, the third spacer layer 161 exposed by the preliminary contact hole and the active pattern 106 thereunder may be additionally etched. In the etching process, an upper portion of the isolation pattern 104 adjacent to the active pattern 106 may be partially etched together. A third spacer 160c may be formed on the second spacer 160b.

Accordingly, a contact hole 212 isolated by the bit line structure 150 and the fence insulation structure 210 may be formed. The active pattern 106 may be exposed by a bottom of the contact hole 212. The process for removing the filling insulation layer 200 may include a wet etching process.

Figure 27:
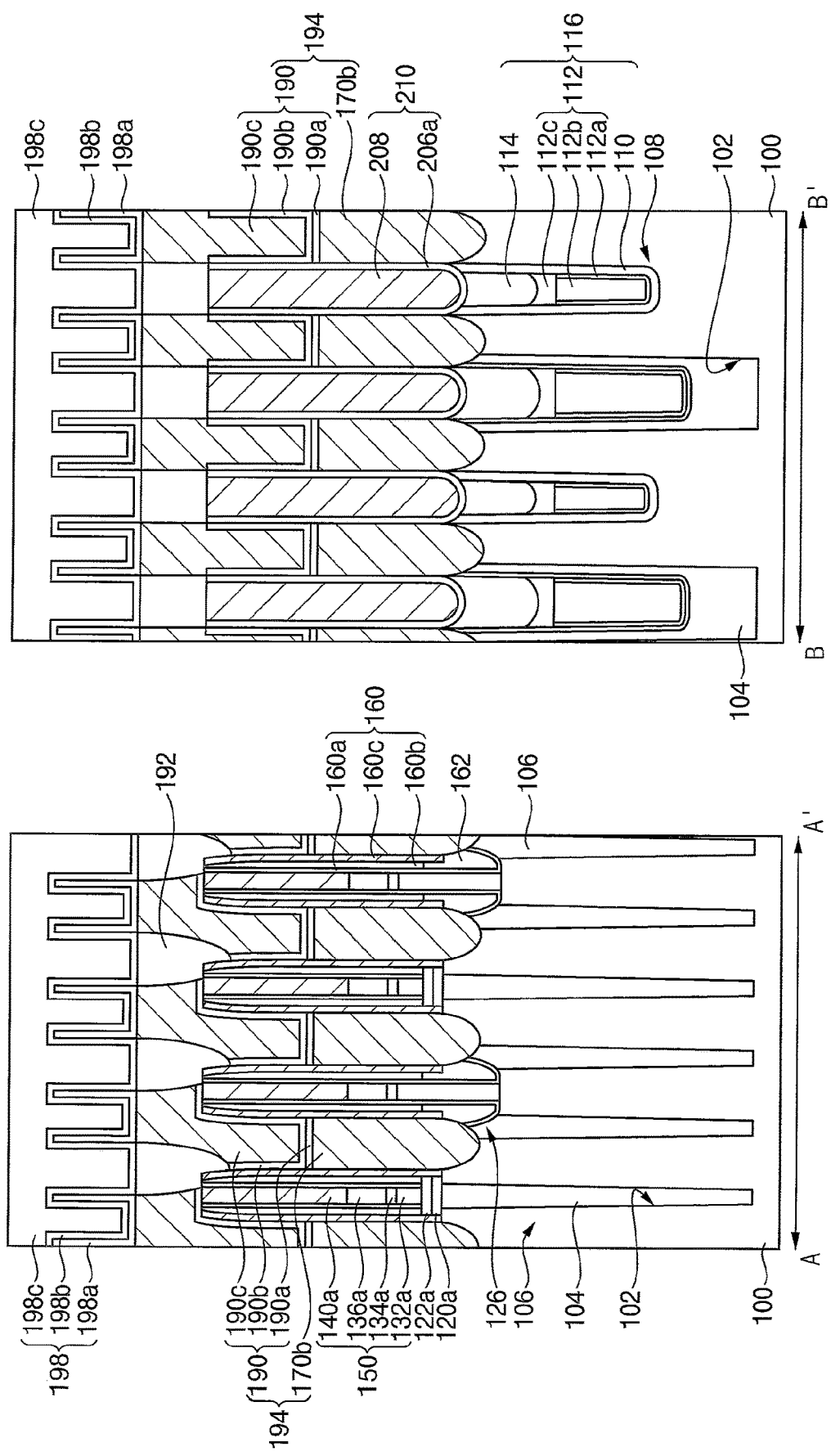

Referring to FIG. 27, the contact plug structure 194 may be formed in the contact hole 212. The contact plug structure 194 may include or may be formed of metal and/or polysilicon.

For example, a conductive layer may be formed to fill the contact hole 212, and an upper portion of the conductive layer may be removed to form the lower contact plug 170b. The lower contact plug 170b may include or may be formed of polysilicon. An upper contact plug 190 including a metal may be formed on the lower contact plug 170b. For example, the upper contact plug 190 may be formed by the same process as described with reference to FIG. 18.

Thereafter, the capacitor 198 may be formed on an upper surface of the contact plug structure 194.

As the above processes are performed, the semiconductor device may be manufactured.

FIGS. 28 to 32 are cross-sectional views illustrating a method of manufacturing a semiconductor device in accordance with example embodiments.

The method of manufacturing the semiconductor device includes processes substantially the same as or similar to those described with reference to FIGS. 22 to 27, so that a redundant description thereof may be omitted. In the following manufacturing method, first, the fence insulation structure may be formed, and then the contact plug structure may be formed. Further, when the fence insulation structure is formed, the barrier insulation pattern may be formed after forming the fence insulation pattern.

Figure 28:
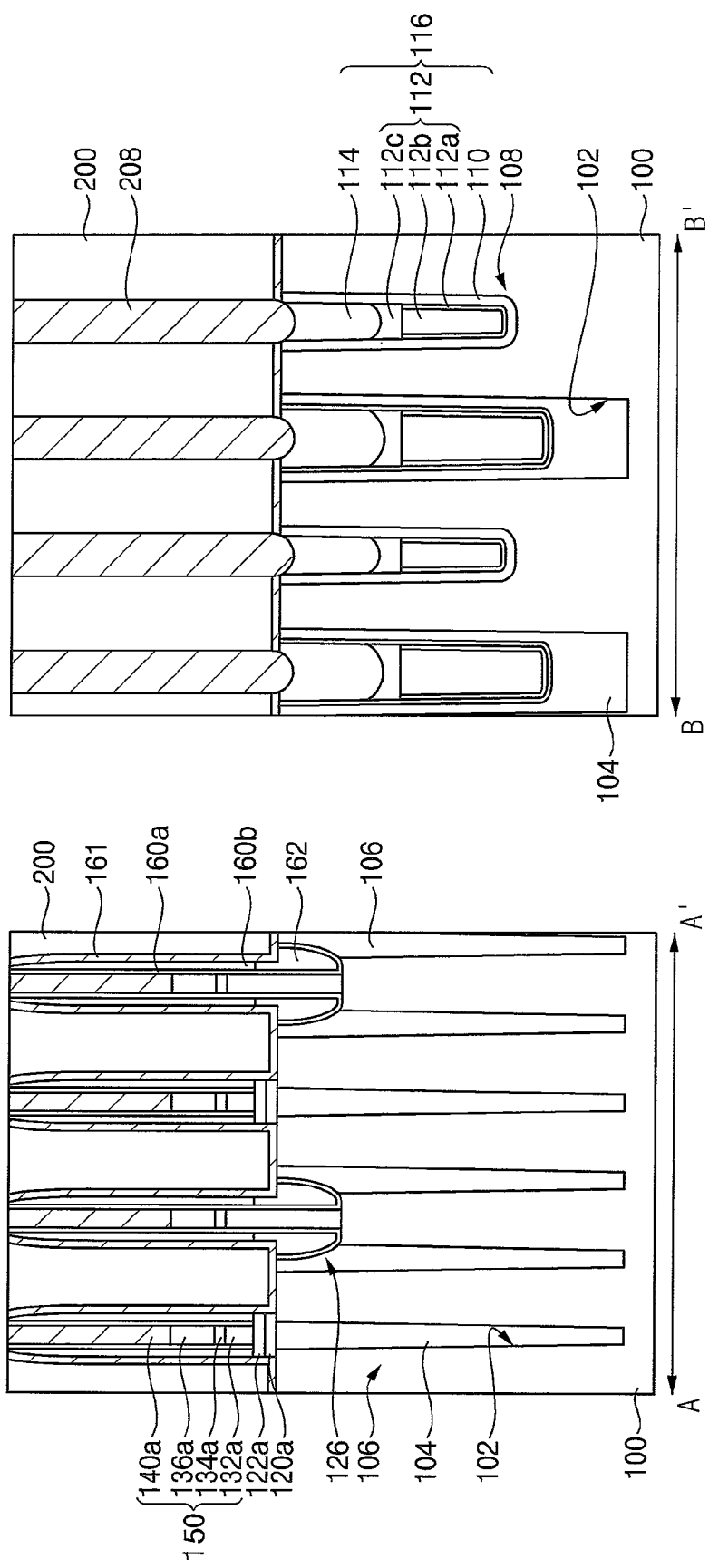

Referring to FIG. 28, processes substantially the same as or similar to those described with reference to FIGS. 4 to 8 may be performed. Thereafter, the same process as described with reference to FIGS. 22 and 23 may be performed.

A fence insulation layer may be formed on the filling insulation layer 200, the second capping layer pattern 140a and the third spacer layer 161 to completely fill the second opening 204. The fence insulation layer may include or may be formed of, e.g., silicon nitride.

Thereafter, the fence insulation layer may be planarized until upper surfaces of the filling insulation layer 200 and the second capping layer pattern 140a may be exposed to form the fence insulation pattern 208 in the second opening 204. In this case, first, the fence insulation pattern 208 may be formed before forming the barrier insulation layer.

The filling insulation layer 200 may have an isolated pattern shape by the bit line structure 150 and the fence insulation pattern 208.

Figure 29:
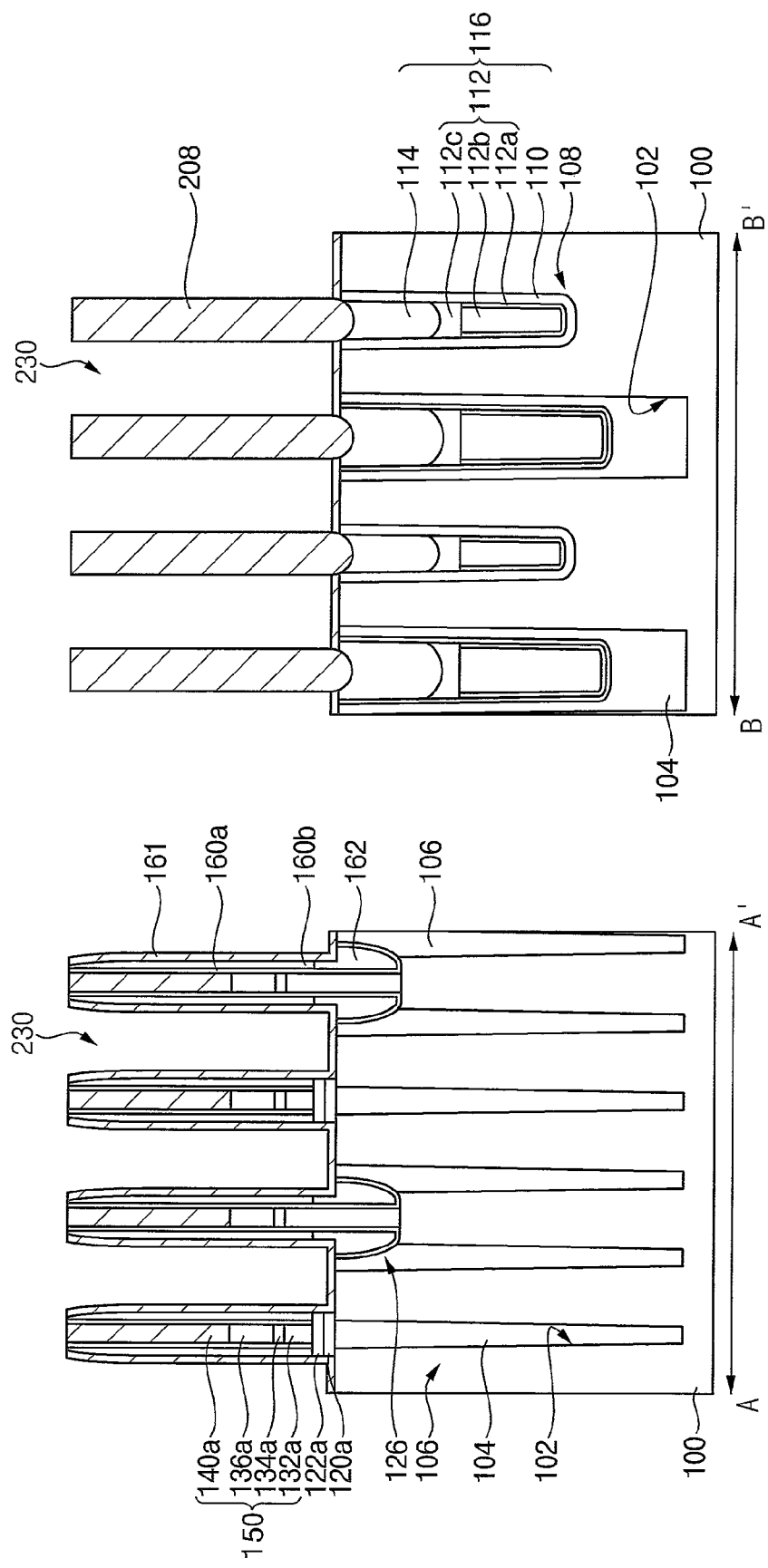

Referring to FIG. 29, the filling insulation layer 200 may be removed to form a preliminary contact hole 230 isolated by the bit line structure 150 and the fence insulation pattern 208. The process of removing the filling insulation layer 200 may include a wet etching process.

When the above process is performed, a portion of sidewalls of the fence insulation pattern 208 may be exposed. For example, sidewalls in the first direction of the fence insulation pattern 208 may be exposed. Sidewalls in the second direction of the fence insulation pattern 208 may contact the third spacer layer 161 on the sidewall of the bit line structure 150.

Figure 30:
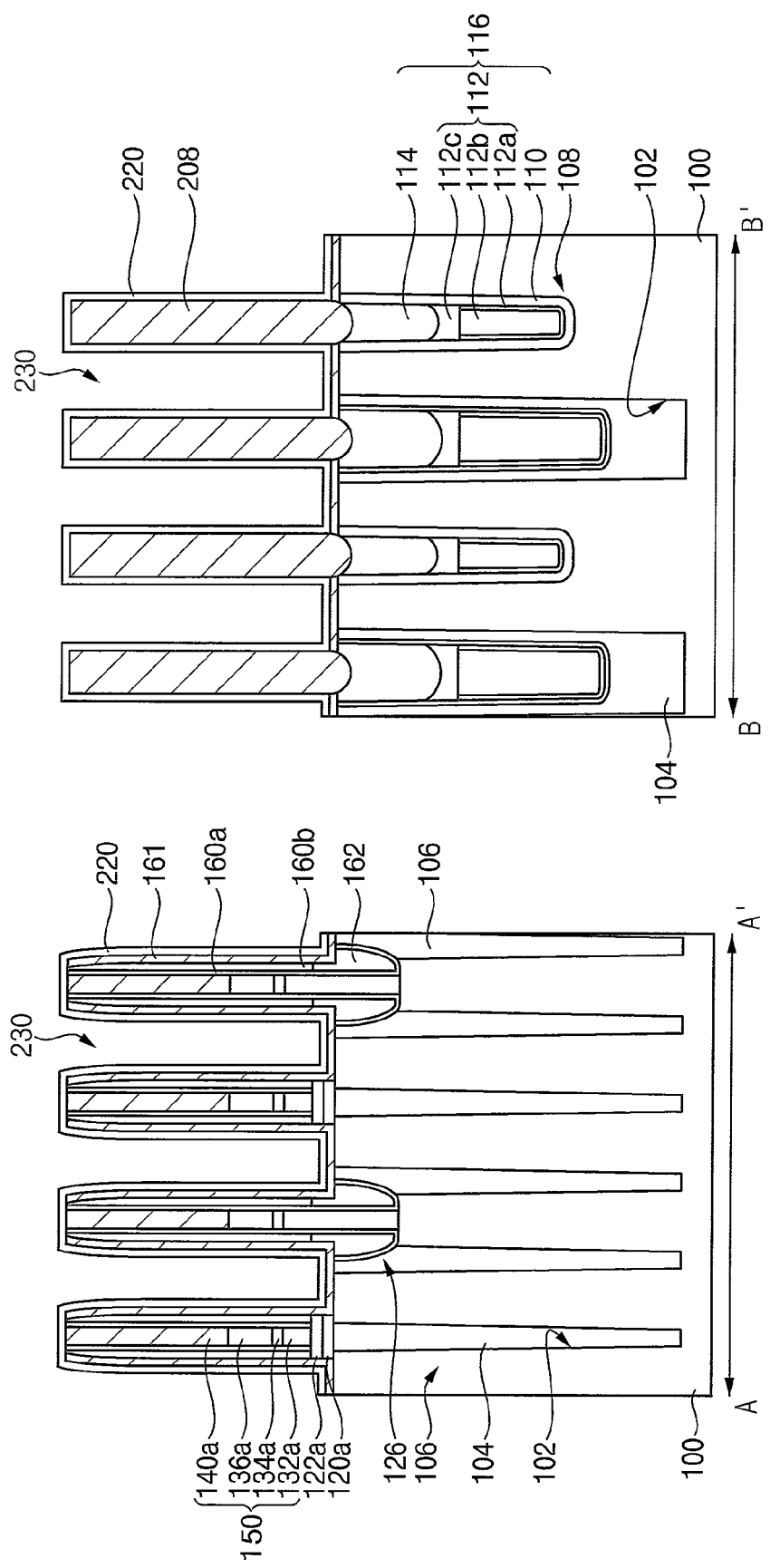

Referring to FIG. 30, a barrier insulation layer 220 may be conformally formed on the exposed sidewall and an upper surface of the fence insulation pattern 208, a surface of the preliminary contact hole 230 and an upper surface of the bit line structure 150. The barrier insulation layer 220 may be formed by a deposition process. In example embodiments, the barrier insulation layer 220 may be formed by an ALD process or a CVD process.

For example, the barrier insulation layer 220 may include or may be formed of aluminum nitride, silicon oxide, aluminum oxide, aluminum oxynitride, silicon oxynitride, BN, or the like.

Figure 31:
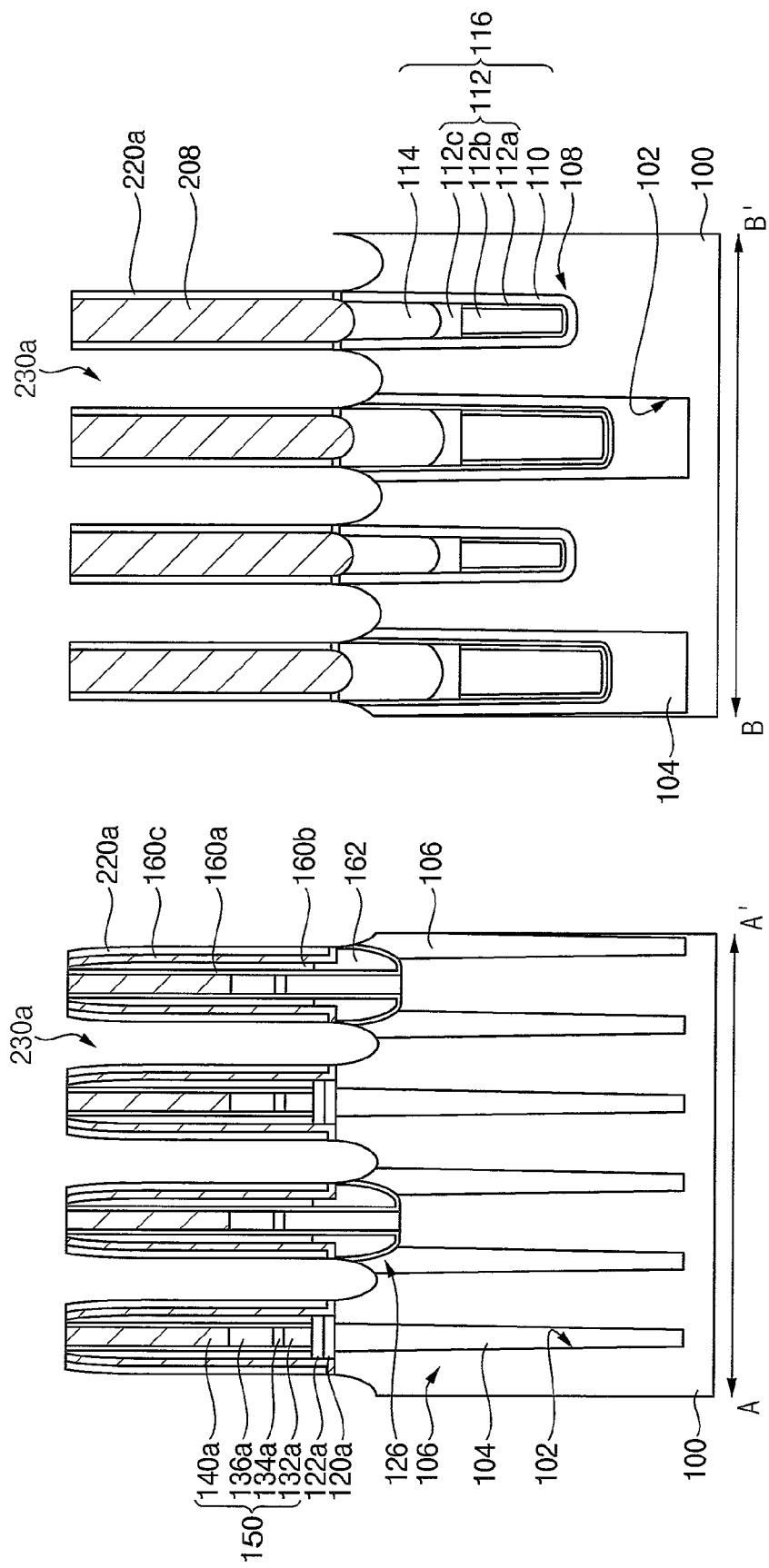

Referring to FIG. 31, the barrier insulation layer 220 positioned on the bottom of the preliminary contact hole 230 may be removed by anisotropic etching process. In the etching process, the barrier insulation layer 220 on the upper surface of the fence insulation pattern 208 and the upper surface of the bit line structure 150 may be removed together.

Therefore, a barrier insulation pattern 220a may be formed to cover a portion of the sidewalls of the fence insulation pattern 208. The barrier insulation pattern 220a may be formed to cover the sidewalls in the first direction of the fence insulation pattern 208. The barrier insulation pattern 220a may surround a sidewall of the preliminary contact hole 230.

Thereafter, the third spacer layer 161 on the bottom of the preliminary contact hole 230 and the active pattern 106 thereunder may be further etched. In the etching process, an upper portion of the isolation pattern 104 adjacent to the active pattern 106 may be partially etched together. Therefore, a contact hole 230a isolated by the bit line structure 150 and the fence insulation pattern 208 may be formed.

Figure 32:
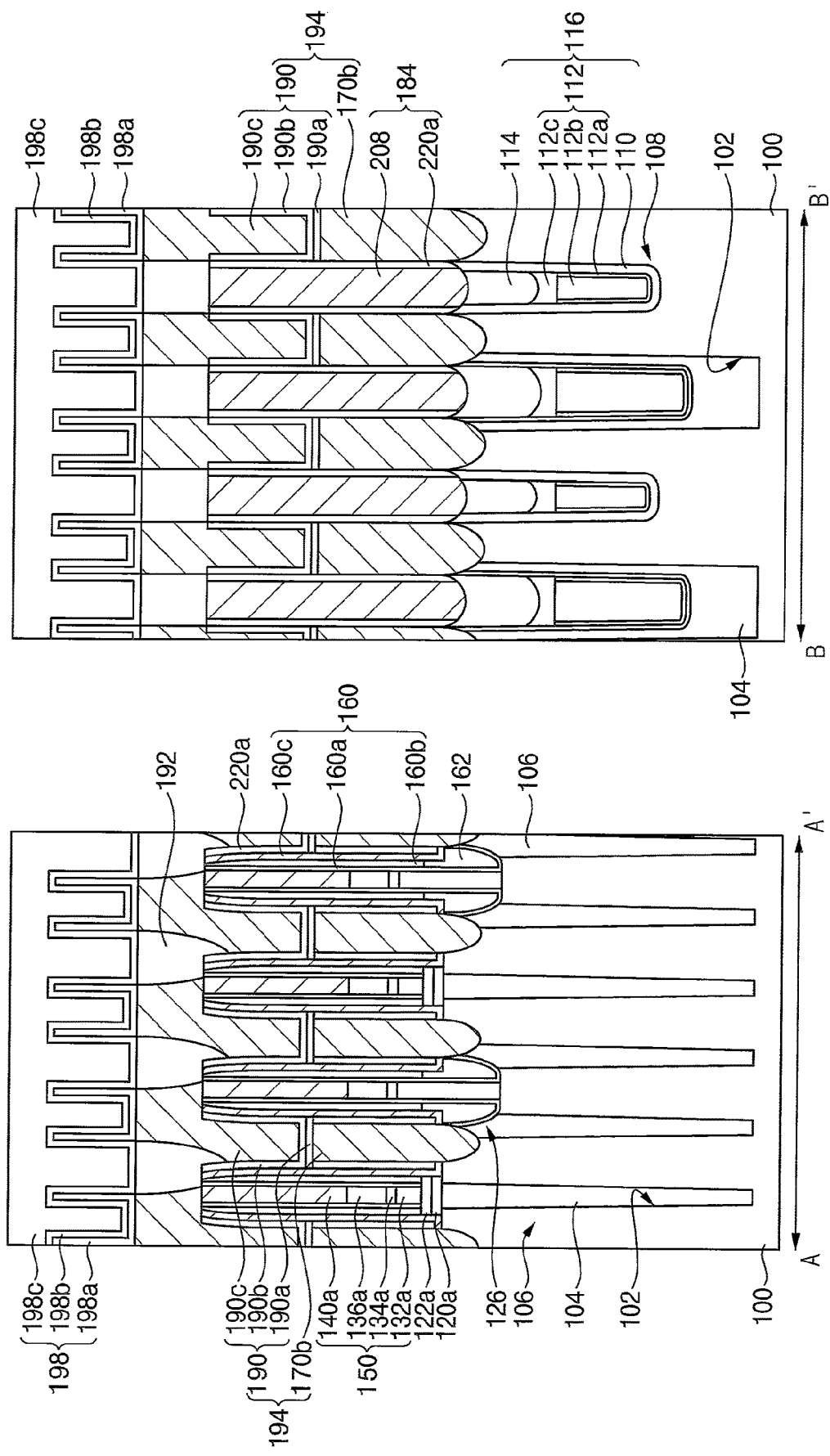

Referring to FIG. 32, the contact plug structure 194 may be formed in the contact hole 230a. The contact plug structure 194 may include metal and/or polysilicon. For example, the contact plug structure 194 may be formed by performing the same process as described with reference to FIG. 27.

Thereafter, the capacitor 198 may be formed on an upper surface of the contact plug structure 194.

As described above, the semiconductor device may be manufactured. The semiconductor device may have a slightly different structure from the semiconductor device illustrated in FIGS. 1 to 3. For example, the fence insulation structure in the semiconductor device may have a different structure from the fence insulation structure in the semiconductor device illustrated in FIGS. 1 to 3. Hereinafter, structural features in the semiconductor device may be briefly described.

Figure 33:
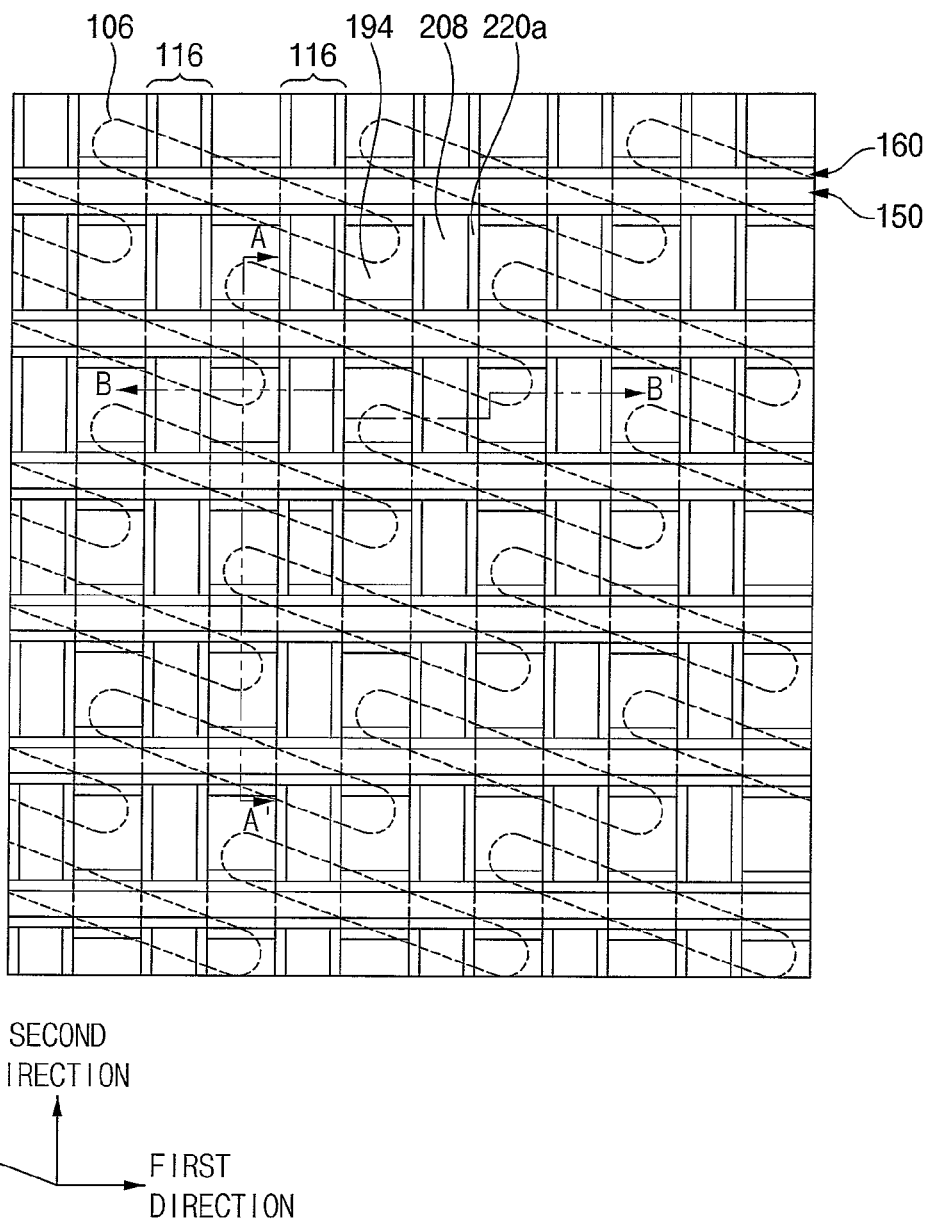
Figure 34:
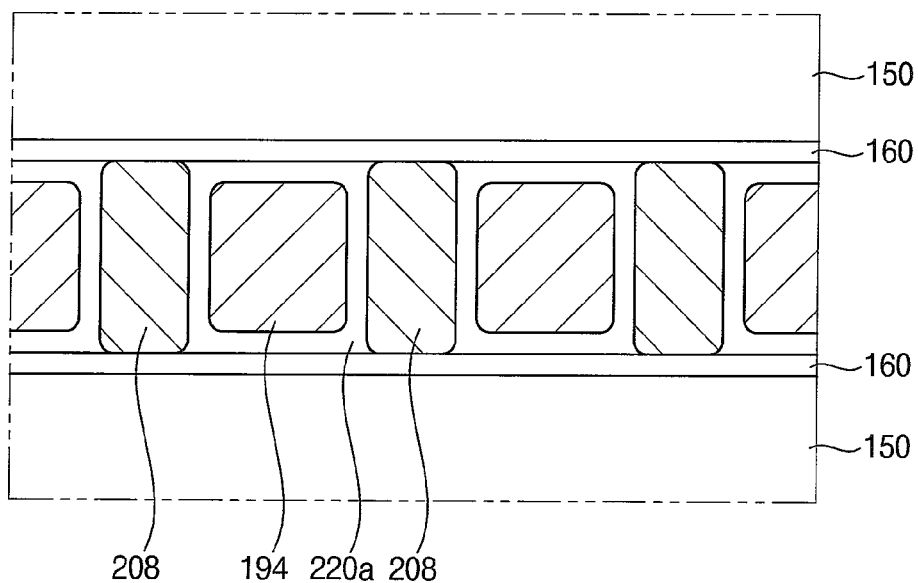

FIG. 33 is a plan view of the semiconductor device in accordance with example embodiments. FIG. 34 is an enlarged plan view of a portion of the semiconductor device in accordance with example embodiments.

Particularly, FIG. 34 shows the contact plug structure 194, the fence insulation pattern 208, and the barrier insulation pattern 220a.

Referring to FIGS. 32 to 34, in the semiconductor device, the barrier insulation pattern 220a may not cover an entire sidewall of the fence insulation pattern 208. The barrier insulation pattern 220a may cover the sidewall in the first direction of the fence insulation pattern 208. Also, the barrier insulation pattern 220a may not be formed on a lower surface of the fence insulation pattern 208.

The barrier insulation pattern 220a may be formed on the sidewall of the contact hole 230a for forming the contact plug structure 194. Therefore, the barrier insulation pattern 220a may surround the contact plug structure 194.

Figure 35:
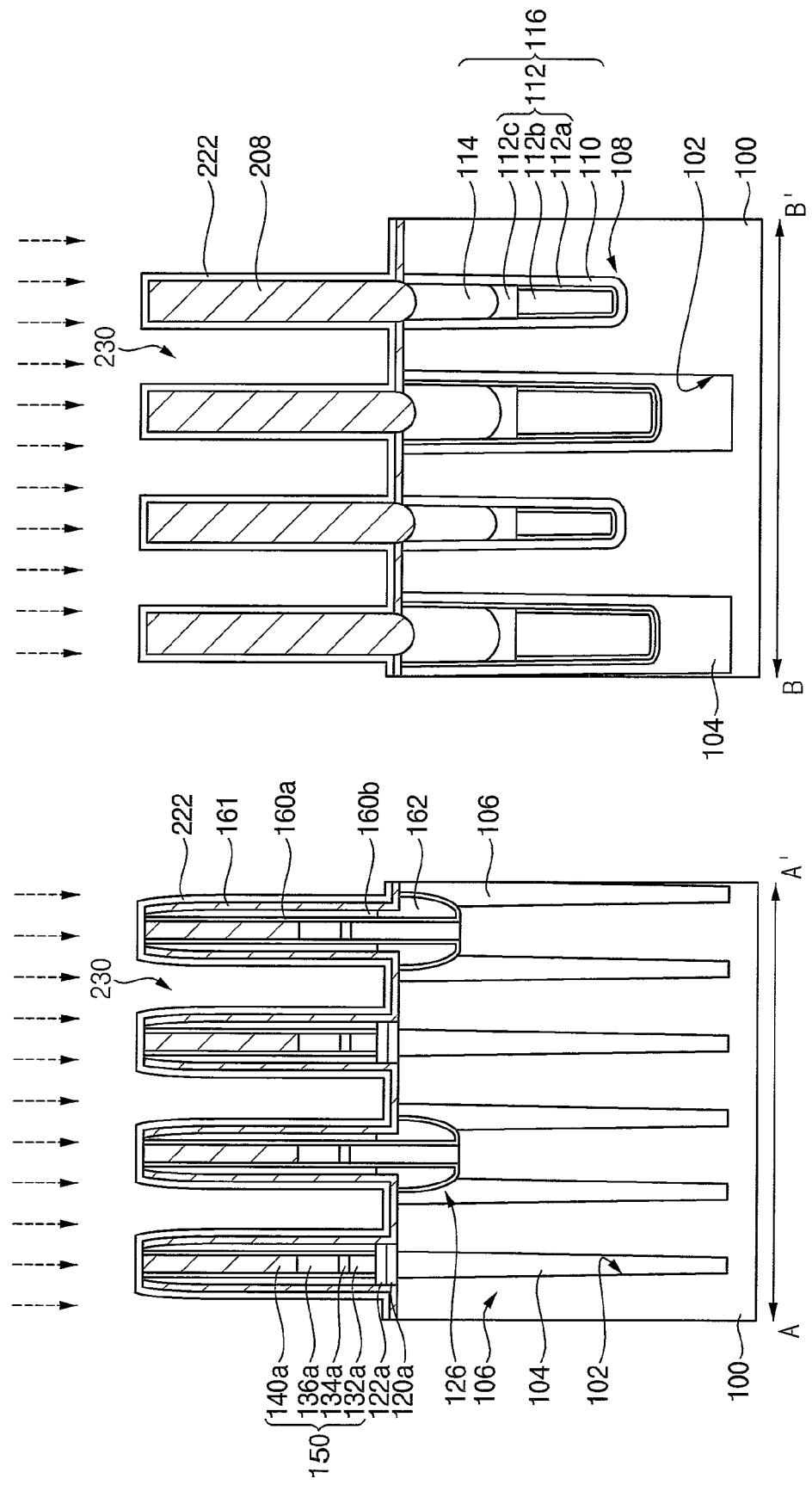
Figure 36:
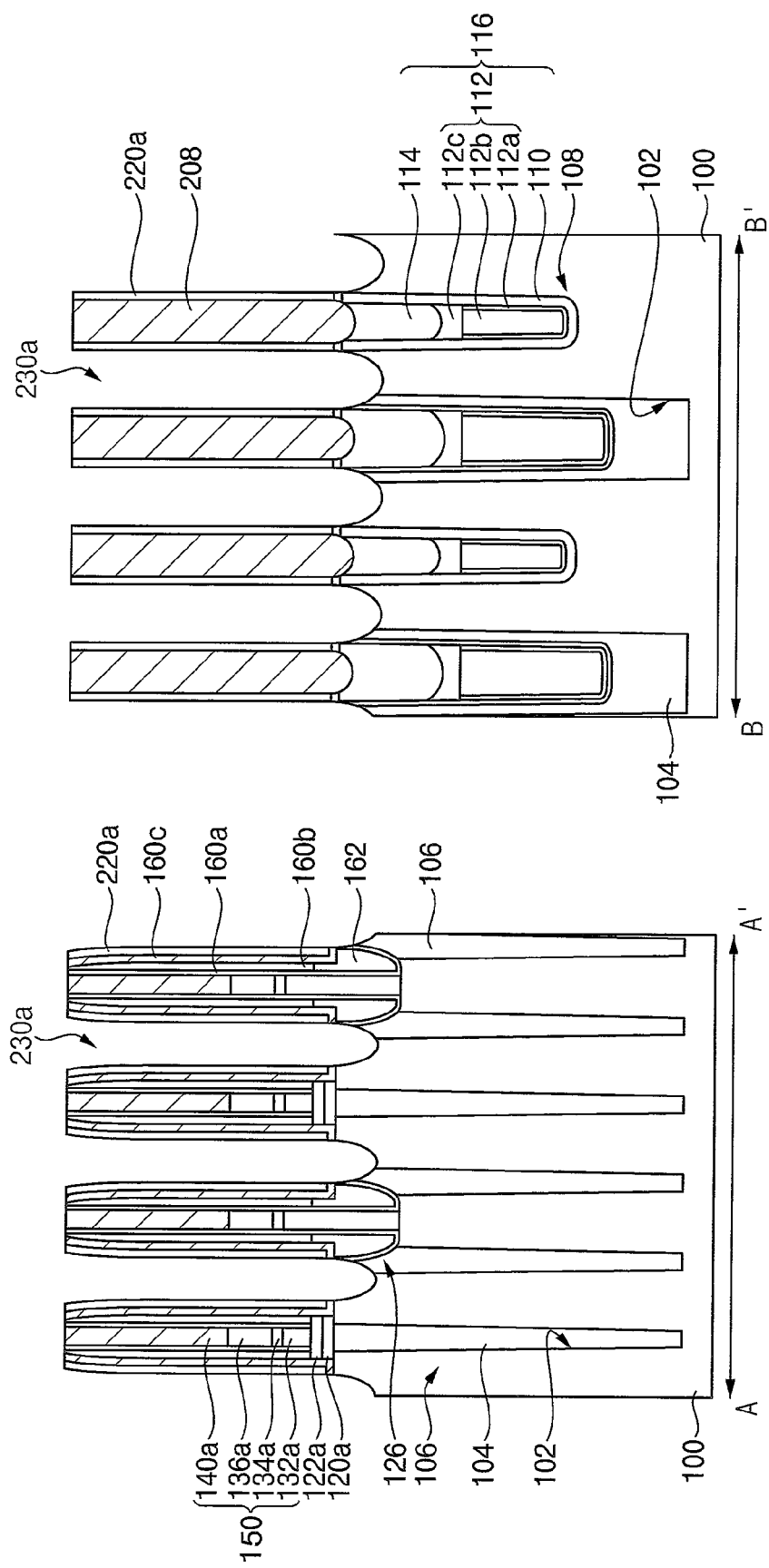

FIGS. 35 and 36 are cross-sectional views illustrating a method of manufacturing a semiconductor device in accordance with example embodiments.

The method of manufacturing the semiconductor device includes processes substantially the same as or similar to those described with reference to FIGS. 28 to 32, so that a redundant description thereof may be omitted. In the following manufacturing method, first, the fence insulation structure may be formed, and then the contact plug structure may be formed. Further, when the fence insulation structure is formed, the barrier insulation pattern may be formed after forming the fence insulation pattern.

Referring to FIG. 35, processes substantially the same as or similar to those described with reference to FIGS. 28 and 29 may be performed.

Thereafter, aluminum may be doped on the exposed sidewalls and upper surface of the fence insulation pattern 208. Accordingly, the barrier insulation layer 222 may be formed on the sidewalls and the upper surface of the fence insulation pattern 208. In this case, the barrier insulation layer 222 may be aluminum-doped silicon nitride.

Since the aluminum is also doped on an inner surface of the preliminary contact hole 230, the barrier insulation layer 222 may also be formed on the inner surface of the preliminary contact hole 230. For example, the barrier insulation layer 222 may also be formed on the surface of the third spacer layer 161 exposed by the preliminary contact hole 230. In some example embodiments, the barrier insulation layer 222 may not be formed on the surface of the third spacer layer 161 depending on materials of the third spacer layer 161.

In some example embodiments, the barrier insulation layer 222 may be formed by oxidizing the exposed sidewalls and upper surface of the fence insulation pattern 208. In this case, the barrier insulation layer 222 may be silicon oxide. In the oxidation process, the surface of the third spacer layer 161 exposed by the preliminary contact hole 230 may also be partially oxidized. Therefore, the barrier insulation layer 222 may be also formed on the surface of the third spacer layer 161.

In some example embodiments, the exposed sidewalls and upper surface of the fence insulation pattern 208 may be doped with aluminum, and then oxidized to form the barrier insulation layer 222. In this case, the barrier insulation layer 222 may include aluminum-doped silicon oxynitride.

As such, after forming the fence insulation pattern 208, the barrier insulation layer 222 may be formed by doping impurities or performing an oxidation process on the exposed surface of the fence insulation pattern 208.

Referring to FIG. 36, the barrier insulation layer 222 positioned on a bottom of the preliminary contact hole 230 may be removed by anisotropic etching process. In the etching process, the barrier insulation layer 222 on the upper surface of the fence insulation pattern 208 and the upper surface of the bit line structure 150 may be removed together.

Accordingly, a barrier insulation pattern 220a may be formed to cover a portion of sidewalls of the fence insulation pattern 208. The barrier insulation pattern 220a may cover the sidewalls in the first direction of the fence insulation pattern 208. In example embodiments, the barrier insulation pattern 220a may surround a sidewall of the preliminary contact hole 230.

Thereafter, the third spacer layer 161 in the preliminary contact hole 230 and upper portions of the isolation pattern 104 adjacent to the active pattern 106 may also be partially etched. Therefore, a contact hole 230a isolated by the bit line structure 150 and the fence insulation pattern 208 may be formed.

In the semiconductor device formed by the above process, the barrier insulation pattern included in the fence insulation structure may cover the sidewalls in the first direction of the fence insulation pattern. The barrier insulation pattern may not be formed on the lower surface of the fence insulation pattern.

Thereafter, the same process described with reference to FIG. 32 may be performed, so that the semiconductor device may be manufactured.

The fence insulation structure in the semiconductor device may have various stacked structures including the barrier insulation pattern and the fence insulation pattern. Hereinafter, examples of the structure of the fence insulation structure may be described.

Figure 37:
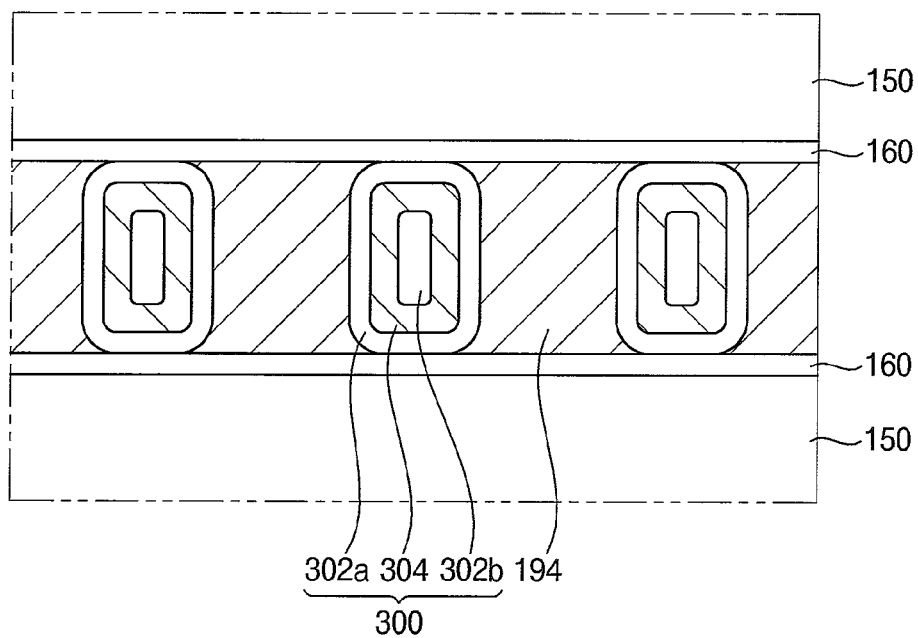
Figure 38:
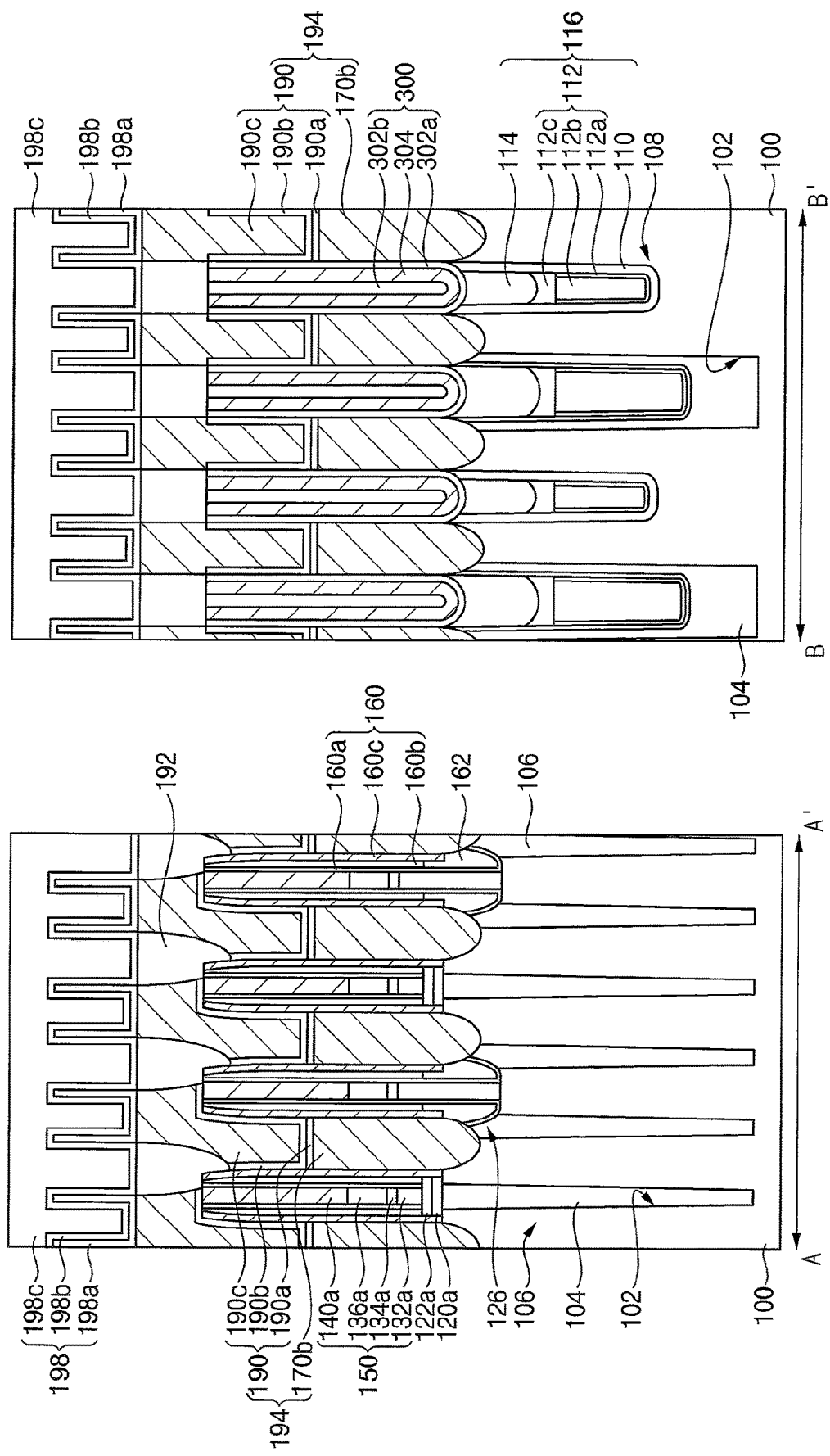

FIG. 37 is an enlarged plan view of a portion of a semiconductor device in accordance with example embodiments. FIG. 38 is a cross-sectional view of a semiconductor device in accordance with example embodiments.

Referring to FIGS. 37 and 38, the fence insulation structure 300 may include a first barrier insulation pattern 302a, a fence insulation pattern 304 and a second barrier insulation pattern 302b. The first barrier insulation pattern 302a and the fence insulation pattern 304 may be conformally formed on a surface of the opening between the bit line structures 150 and the contact plug structures 194. The second barrier insulation pattern 302b may fill the opening.

Figure 39:
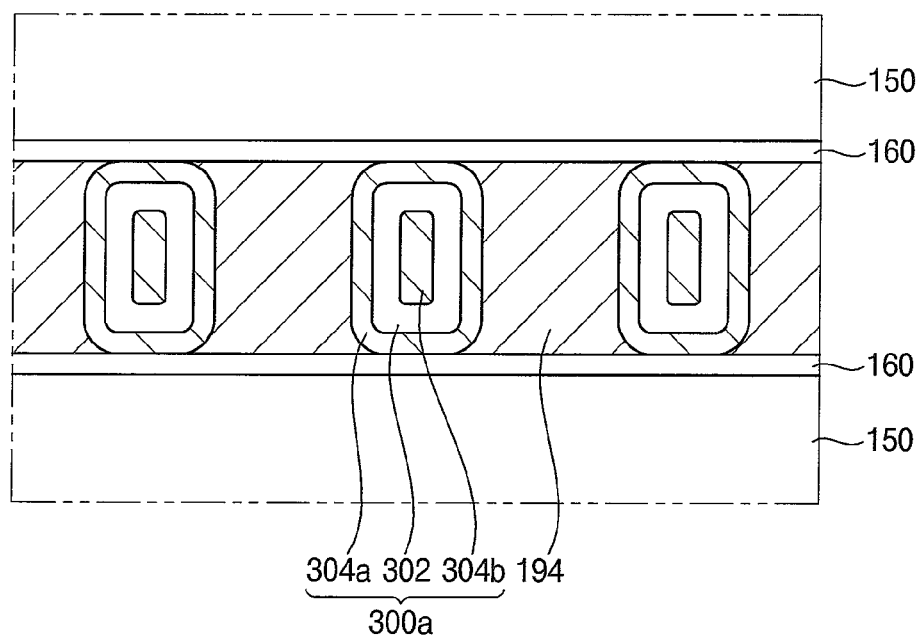
Figure 40:
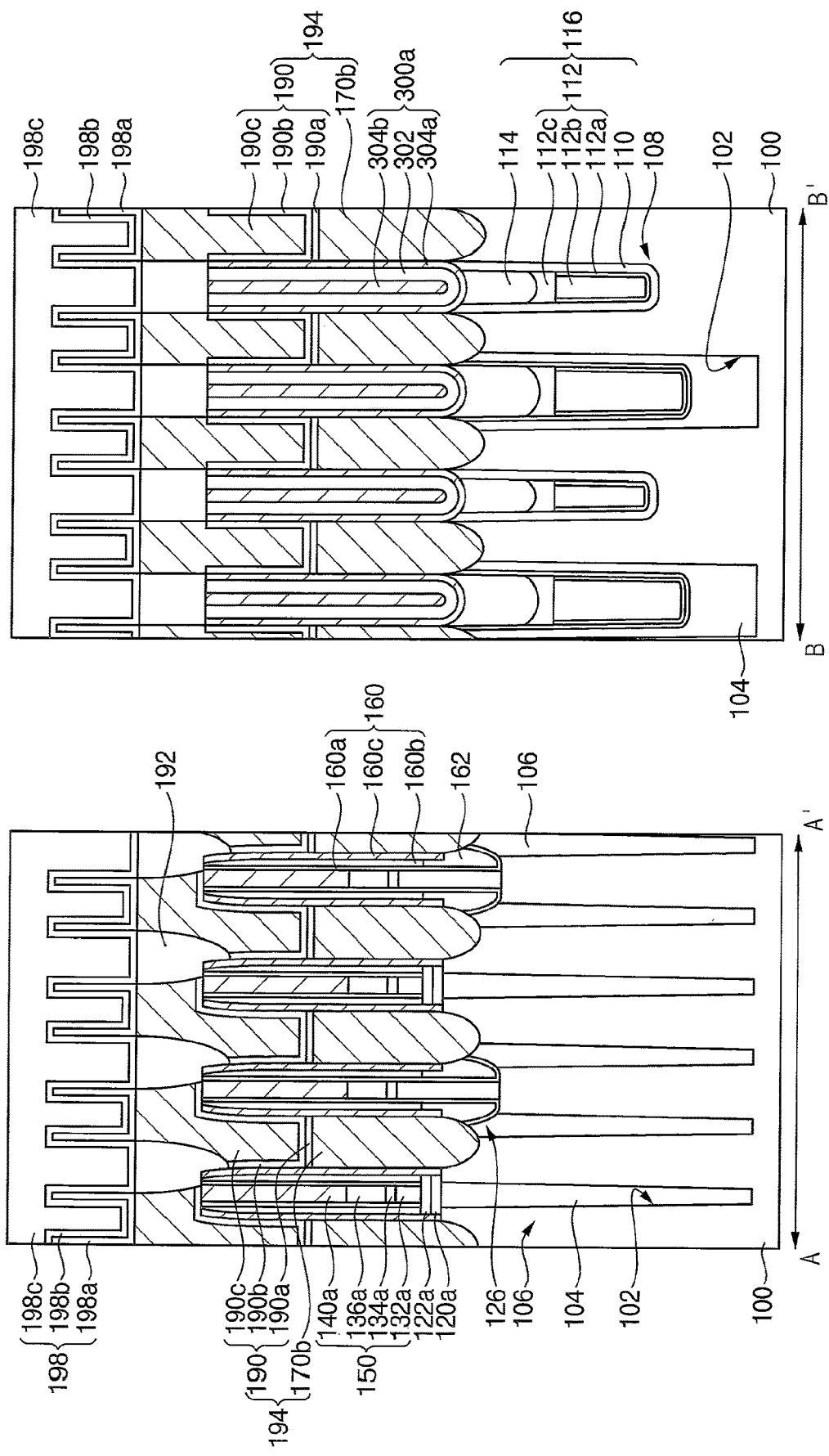

FIG. 39 is an enlarged plan view of a portion of a semiconductor device in accordance with example embodiments. FIG. 40 is a cross-sectional view of a semiconductor device in accordance with example embodiments.

Referring to FIGS. 39 and 40, the fence insulation structure 300a may include a first fence insulation pattern 304a, a barrier insulation pattern 302, and a second fence insulation pattern 304b. The first fence insulation pattern 304a and the barrier insulation pattern 302 may be conformally formed on a surface of the opening between the bit line structures 150 and the contact plug structures 194. The second fence insulation pattern 304b may fill the opening.

Figure 41:
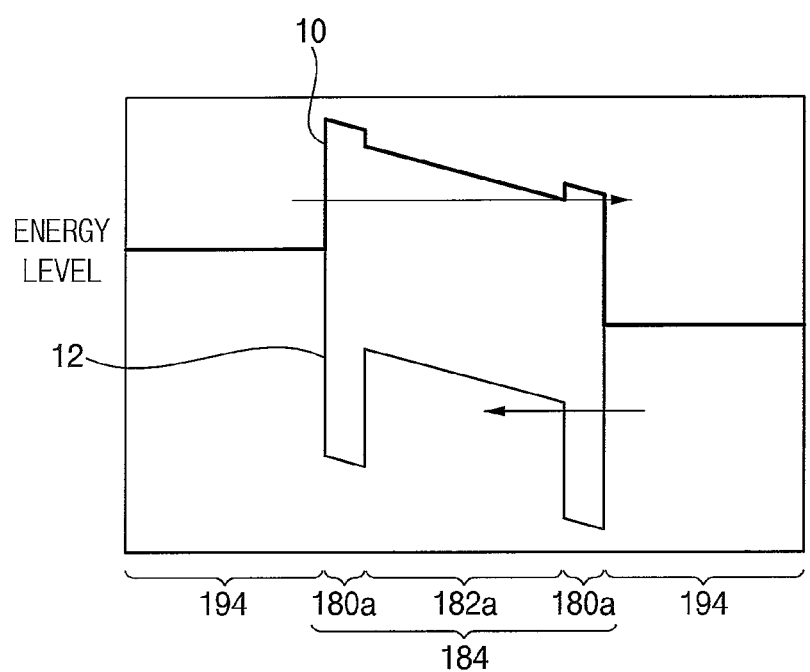

FIG. 41 illustrates energy levels of a contact plug structure and a fence insulation structure in a semiconductor device in accordance with example embodiments.

In FIG. 41, reference numeral 10 denotes an energy level of an electron, and reference numeral 12 denotes an energy level of a hole.

In FIG. 41, different voltages may be applied to adjacent contact structures, respectively. For example, when different data is written to each DRAM cell including the contact structure, different voltages may be applied to each of the contact structures.

In FIG. 41, the contact plug structure 194/the fence insulation structure 184/the contact plug structure 194 may be disposed in the first direction. In a cross-sectional view taken in the first direction, the contact plug structure 194, the barrier insulation pattern 180a, the fence insulation pattern 182a, the barrier insulation pattern 180a, and the contact plug structure 194 may be sequentially disposed.

Referring to FIG. 41, a band gap of energy level of holes in the barrier insulation pattern 180a may be greatly increased. Further, a band gap of energy level of electrons in the barrier insulation pattern 180a may be also increased.

As the barrier insulation pattern 180a is formed, electron tunneling and hole tunneling between the contact plug structures may be decreased. Particularly, the tunneling of the hole may be decreased. Therefore, defects in which leakage currents are generated between the contact plug structures 194 due to tunneling of the electrons and holes through the fence insulation structure 184 may be decreased.

As described above, in the semiconductor device, leakage currents between the contact plug structures may be decreased. Therefore, the semiconductor device may have excellent electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   contact plug structures on a substrate, the contact plug structures being spaced apart from each other in a first direction; and
   an insulation structure filling a space between the contact plug structures to insulate the contact plug structures from each other, the insulation structure including a first insulation pattern and a second insulation pattern,
   wherein the second insulation pattern includes an insulation material having an etch selectivity with respect to silicon oxide, and
   wherein the first insulation pattern contacts sidewalls of the second insulation pattern and sidewalls of the contact plug structure, and the first insulation pattern includes a material having a band gap higher than a band gap of the second insulation pattern.

2. The semiconductor device of claim 1, wherein the first insulation pattern includes a material having a band gap higher than a band gap of a silicon nitride.

3. The semiconductor device of claim 1, wherein the first insulation pattern includes aluminum nitride, silicon oxide, aluminum oxide, aluminum oxynitride, silicon oxynitride or BN.

4. The semiconductor device of claim 1, wherein the first insulation pattern includes aluminum-doped silicon nitride or aluminum-doped silicon oxynitride.

5. The semiconductor device of claim 1, wherein the second insulation pattern includes silicon nitride, SiOCN, BN or SiOC.

6. The semiconductor device of claim 1, wherein the insulation structure is formed in an opening between the contact plug structures, and
   the first insulation pattern is formed along sidewalls and bottom of the opening, and the second insulation pattern is formed on the first insulation pattern to fill the opening.

7. The semiconductor device of claim 1, wherein the first insulation pattern surrounds sidewalls and a bottom of the second insulation pattern.

8. The semiconductor device of claim 1, wherein the first insulation pattern contacts at least sidewalls in the first direction of the second insulation pattern.

9. The semiconductor device of claim 1, wherein the first insulation pattern surrounds sidewalls of the contact plug structure.

10. The semiconductor device of claim 1, further comprising bit line structures extending in the first direction and spaced apart from each other in a second direction perpendicular to the first direction on the substrate, and
the contact plug structures and insulation structures are disposed between the bit line structures.

11. A semiconductor device, comprising:
bit line structures on a substrate, the bit line structures extending in a first direction and spaced apart from each other in a second direction perpendicular to the first direction;
contact plug structures on the substrate between the bit line structures, the contact plug structures being spaced apart from each other in the first direction; and
an insulation structure filling an opening between the contact plug structures to insulate the contact plug structures from each other, the insulation structure including a first insulation pattern and a second insulation pattern,
wherein the second insulation pattern includes an insulation material having an etch selectivity with respect to silicon oxide,
wherein the first insulation pattern surrounds sidewalls and a bottom of the second insulation pattern, and the first insulation pattern includes a material having a band gap higher than a band gap of the second insulation pattern.

12. The semiconductor device of claim 11, wherein the first insulation pattern includes a material having a band gap higher than that of silicon nitride.

13. The semiconductor device of claim 11, wherein the first insulation pattern includes aluminum nitride, silicon oxide, aluminum oxide, aluminum oxynitride, silicon oxynitride or BN.

14. The semiconductor device of claim 11, wherein the first insulation pattern includes aluminum-doped silicon nitride or aluminum-doped silicon oxynitride.

15. The semiconductor device of claim 11, wherein the second insulation pattern includes silicon nitride, SiOCN, BN or SiOC.

16. The semiconductor device of claim 11, further comprising a spacer structure formed on a sidewall of each of the bit line structures,
wherein the first insulation pattern contacts the spacer structure.

17. A semiconductor device, comprising:
an active pattern on a substrate;
gate structures buried in an upper portion of the active pattern, the gate structures being spaced apart from each other in a first direction, and the gate structures extending in a second direction perpendicular to the first direction;
bit line structures on the substrate, the bit line structures extending in the first direction and spaced apart from each other in the second direction;
a spacer structure on a sidewall of each of the bit line structures;
contact plug structures formed in an opening between the bit line structures on the substrate, the contact plug structures being spaced apart from each other in the first direction; and
a fence insulation structure filling a region between the bit line structures and between the contact plug structures to insulate the contact plug structures from each other, the fence insulation structure including a first insulation pattern and a second insulation pattern,
wherein the second insulation pattern includes silicon nitride, and
wherein the first insulation pattern contacts a portion of sidewalls of the second insulation pattern and a portion of sidewalls of the contact plug structure, and the first insulation pattern includes a material having a band gap higher than a band gap of the second insulation pattern.

18. The semiconductor device of claim 17, wherein the fence insulation structure is disposed to face the gate structures in a vertical direction.

19. The semiconductor device of claim 17, wherein the first insulation pattern surrounds sidewalls and a bottom of the second insulation pattern.

20. The semiconductor device of claim 17, wherein the first insulation pattern includes aluminum nitride, silicon oxide, aluminum oxide, aluminum oxynitride, silicon oxynitride or BN.

* * * * *